United States Patent
Dickerson et al.

(10) Patent No.: US 8,405,138 B2
(45) Date of Patent: Mar. 26, 2013

(54) DENSELY-PACKED FILMS OF LANTHANIDE OXIDE NANOPARTICLES VIA ELECTROPHORETIC DEPOSITION

(75) Inventors: James Dickerson, Nashville, TN (US); Sameer V. Mahajan, Chandler, AZ (US)

(73) Assignee: Vanderbilt University, Nashville, TN (US)

( * ) Notice: Subject to any disclaimer, the term of this patent is extended or adjusted under 35 U.S.C. 154(b) by 9 days.

(21) Appl. No.: 12/898,159

(22) Filed: Oct. 5, 2010

(65) Prior Publication Data

US 2011/0084326 A1    Apr. 14, 2011

Related U.S. Application Data

(63) Continuation-in-part of application No. 12/587,401, filed on Oct. 5, 2009.

(51) Int. Cl.
*H01L 29/788* (2006.01)
(52) U.S. Cl. ............................... 257/316; 257/E21.179
(58) Field of Classification Search .......... 438/257–267; 257/316–321, E21.179
See application file for complete search history.

(56) References Cited

PUBLICATIONS

Dor S. et al., The influence of suspension composition and deposition mode on the electrophoretic deposition of TiO2 nanoparticle agglomerates, 2009, Colloids Surf. A, 342, 70-75.
J. C. Wang et al., Characteristics of Godolinium Oxide Nanocrystal Memory with Optimized Rapid Thermal Annealing, Electrochem. Solid State Lett., 12, H202-H204 (2009).
Carnall W. T. et al., Electronic Energy Levels of the Trivalent Lanthanide Aquo Ions. IV. Eu8+, 1968, J. Chem. Phys., 49, 4450-4455.
Shim M. et al., Permanent dipole moment and charges in colloidal semiconductor quantum dots, 1999 J. Chem. Phys., 111, 6955-64.
Wakefield G. et al., Synthesis and Properties of Sub-50-nm Europium Oxide Nanoparticles, 1999, J. Colloid Interface Sci., 215, 179-82.
Chen F. et al., Preparation of yttria-stabilized zirconia (YSZ) films on LA0.85Sr0.15MnO3 (LSM) and LSM-YSZ substrates using an electrophoretic deposition (EPD) Process, 2001, J. Eur. Ceram. Soc., 21, 127-34.
Ferrari B. et al., Sandwich materials formed by thick alumina tapes and thin-layered alumina-aluminium titanate structures shaped by EPD, 2009 J. Eur. Ceram. Soc., 29, 1083-92.
Mahajan S. V. et al., Electrophoretic deposition and characterization of Eu2O3 nanocrystal-Carbon nanotube heterostructures, 2010 J. Eur. Ceram. Soc., 30, 1145-50.
Singh I. et al., Bioactive ceramic coatings containing carbon nanotubes on metallic substrates by electrophoretic deposition, 2006 J. Mater. Sci., 41, 8144-51.
Mahajan S. V. et al., Structural properties of electrophoretically deposited europium oxide nanocrystalline thin films, 2006, J. Mater. Sci., 41, 8160-5.
Podgrabinski, T. et al., Characterization of polystyrene and doped polymethylmethacrylate thin layers, Journal of Materials Science-Materials in Electronics, 2005, 16(11-12), pp. 761-765.
Zhitomirsky I. et al., Electrophoretic deposition of hydroxyapatite, 1997, J. Mater. Sci., Mater. Med., 8, 213-9.

(Continued)

*Primary Examiner* — Richard Booth
(74) *Attorney, Agent, or Firm* — Tim Tingkang Xia, Esq.; Morris Manning & Martin, LLP

(57) ABSTRACT

A method of forming a film of lanthanide oxide nanoparticles. In one embodiment of the present invention, the method includes the steps of: (a) providing a first substrate with a conducting surface and a second substrate that is positioned apart from the first substrate, (b) applying a voltage between the first substrate and the second substrate, (c) immersing the first substrate and the second substrate in a solution that comprises a plurality of lanthanide oxide nanoparticles suspended in a non-polar solvent or apolar solvent for a first duration of time effective to form a film of lanthanide oxide nanoparticles on the conducting surface of the first substrate, and (d) after the immersing step, removing the first substrate from the solution and exposing the first substrate to air while maintaining the applied voltage for a second duration of time to dry the film of lanthanide oxide nanoparticles formed on the conducting surface of the first substrate.

8 Claims, 12 Drawing Sheets

PUBLICATIONS

Maenosono S. et al., Overview of nanoparticle array formation by wet coating, 2003 J. Nanopart. Res., 5, 5-15.

Cho J. et al., Nanostructured carbon nanotube/TiO2 composite coatings using electrophoretic deposition (EPD), 2008, J. Nanopart. Res., 10, 99-105.

Giersig M. et al., Formation of Ordered Two-Dimensional gold Colloid Lattices by Electrophoretic Deposition, 1993, J. Phys. Chem., 97, 6334-6.

Teranishi T. et al., Size Control of Monodispersed Pt Nanoparticles and Their 2D Organization by Electrophoretic Deposition, 1999, J. Phys. Chem. B, 103, 3818-27.

Somarajan S. et al., Controlled Electrophoretic Deposition of Uniquely Nanostructured Star Polymer Films, 2008 J. Phys. Chem. B, 112, 23-8.

Islam M. A. et al., Electrostatic properties of maghemite (y-Fe2O3) nanocrystalline quantum dots determined by electrophoretic deposition, 2009, J. Phys.: Condens. Matter, 21, 8.

Scott G. D. et al., The density of random close packing of spheres, 1969, J. Phys. D: Appl. Phys., 2, 863-6.

W. H. Guan et al., Fabrication and charging characteristics of MOS capacitor structure with metal nanocrystals embedded in gate oxide, J. Phys. D-Appl. Phys., 40, 2754-2758, (2007).

Kim F. et al., Langmuir-Blodgett Nanorod Assembly, 2001, J. Am. Chem. Soc., 123, 4360-1.

J. L. Bridot et al., Hybrid Gadolinium Oxide Nanoparticles: Multimodal Contrast Agents for in Vivo Imaging, J. Am. Chem. Soc., 129, 5076-5084, (2007).

Raue R. et al., Phosphor screens in cathode-ray tubes for projection television, 1989 Philips Tech. Rev., 44, 335-47.

D. W. Kavich et al., Field Dependence of the Spin Relaxation Within a Film of Iron Oxide Nanocrystals Formed via Electrophoretic Deposition, Nanoscale Res. Lett., 2010, Springer.

Sameer V. Mahajan et al., Optical studies of sub-3 nm Eu2O3 and Gd2O3: Eu3+ nanocrystals, Journal of Alloys and Compounds, 2009, 574-577, 488.

S. V. Mahajan et al., Synthesis of RE(OH)2Cl and REOCl(RE=Eu, Tb) nanostructures, Journal of Rare Earths, Apr. 2008, 131-135, 26, 2.

Shengguo Jia et al., Mechanism of the Electrophoretic Deposition of CdSe Nanocrystal Films: Influence of the Nanocrystal Surface and Charge, J. Phys. Chem. C, 2008, 162-171, 112.

John L. Rigueur et al., Buckypaper fabrication by liberation of electrophoretically deposited carbon nanotubes, Carbon, 2010, 4090-4099, 48.

S. V. Mahajan et al., Dielectric properties of colloidal Gd2O3 nanocrystal films fabricated via electrophoretic deposition, Applied Physics Letter, 2010, 113105, 96.

H. Park et al., Spatially localized one-dimensional porous silicon photonic crystals, Applied Physics Letter, 2008, 011113, 92.

Marcela L. Redigolo et al., Magnetization reversal in europium sulfide nanocrystals, Applied Physics Letter, 2006, 222501, 89.

G. F. Fulop et al., Electrodeposition of Semiconductors, Ann. Rev. Mater. Sci., 1985, 197-210, 15.

D. W. Kavich et al., Exchange Bias of singly inverted FeO/Fe3O4 core-shell nanocrystals, Physical Review B, 2008, 174414, 78.

S. Mahajan et al., Self assembly of Eu2O3 nanocrystals and nanoneedles, Phys. State. Sol. C, 2007, 409-411, 4, 2.

M. L. Redigolo et al., Physical properties of quantum-confined europium sulfide nanocrystals, Phys. State. Sol. C, 2007, 406-408, 4, 2.

Heungman Park et al., A novel method of photonic band-gap lithography of porous silicon hetero-structures, Proc. of SPIE, 66400c-1-6, 6640.

Dmitry S Koktysh et al., EuS nanocrystals: a novel synthesis for the generation of monodisperse nanocrystals with size-dependent optical properties, Nanotechnology, 2010, 415601, 1-6, 21.

A. M. Thron et al., Characterization of EuS Nanotubes in Quantum Confinement, Microsc Microanal, 2009, 1178-1179, 15(Supple2).

Melissa A. Harrison et al., Template assisted synthesis of europium sulfide nanotubes, Materials Letters, 2011, 420-423, 65.

Marcela L. Redigolo et al., Europium sulfide nanoparticles in the sub-2 nm size regime, Materials Chemistry and Physics, 2009, 526-529, 115.

Suseela Somarajan et al., Electrophoretic Deposition of Star Polymer-Europium Chalcogenide Nanocomposite Films, Key Engineering Materials, 2009, 113-118, 412.

S. V. Mahajan et al., Understanding the Growth of Eu2O3 nanocrystal films made via electrophoretic deposition, Nanotechnology, 145704, 1-9, 21.

J. Y. Park et al., Paramagnetic Ultrasmall Gadolinium Oxide Nanoparticles as Advanced T1 MRI Contrast Agent: Account for Large Longitudinal Relaxivity, Optimal Particle Diameter, and in T1 MR Images, ACS Nano 3, 3663 (2009).

Morral, A.F.I., et al., Synthesis of silicon nanowires with wurtzite crystalline structure by standard chemical vapor deposition. Advanced Materials, 2007, 19(10), p. 1347.

Park J et al., Synthesis of Monodisperse Spherical Nanocrystals, 2007 Angew. Chem. Int. Edn 46 4630-60.

Murray C B et al., Synthesis and Characterization of Monodisperse Nanocrystals and Close-Packed Nanocrystal Assemblies, 2000 Annu. Rev. Mater. Sci. 30 545-610.

Collier, C.P. et al., Nanocrystal Superlattices, Annu Rev., Phys. Chem., 1998, 49, pp. 371-404.

Dabbousi B O et at., Electroluminescence from CdSe quantumdot/polymer composites, 1995 Appl. Phys. Lett. 66 1316-8.

J. Kwo et al., High gate dielectrics Gd2O3 and Y2O3 for silicon, Appl. Phys. Lett. 77, 130 (2000).

Mochizuki S. et al., Reversible photoinduced spectral change in Eu2O3 at room temperature, 2001 Appl. Phys. Lett. 79 3785-7.

Mohammad A. et al., Electrodeposition of patterned CdSe nanocrystal films using thermally charged nanocrystals, 2002 Appl. Phys. Lett. 80 3823-5.

A. Kanjilal et al., Structural and electrical properties of silicon dioxide layers with embedded germanium nanocrystals grown by molecular beam epitaxy, Appl. Phys. Lett. 82, 1212 (2003).

S.-S. Yim et al.. Formation of Ru nanocrystals by plasma enhanced atomic layer deposition for nonvolatile memory applications, Appl. Phys. Lett. 89, 093115 (2006).

Boccaccini A R et al., Electrophoretic deposition of carbon nanotubes, 2006 Carbon 44 3149-60.

Kuipers, E.W et al., Deposition of Nanocrystals on Flat Supports by Spin-Coating, Catalysis Letters, 1993, 17(1-2), pp. 71-79.

S. A. Hasan et al., Sacrificial layer electrophoretic deposition of free-standing multilayered nanoparticle films, Chem. Commun. 3723 (2009).

Dabbousi B O et al, Langmuir-Blodgett Manipulation of Size-Selected CdSe Nanocrystallites, 1994 Chem. Mater. 6, 216-9.

Tian, Y.C. et al., Langmuir-Blodgett film formation from fluorescence-activated, surfactant capped, size-elected CdSe nanoparticles spread on water surfaces. Chemistry of Materials, 1996, 8(4), pp. 969-974.

Islam M A et al., Controlled Electrophoretic Deposition of Smooth and Robust Fims of CdSe Nanocrystals, 2004 Chem. Mater. 16 49-54.

Zhao G F et al., Ultralow-Dielectric-Constant Films Prepared from Hollow Polyimide Nanoparticles Possessing Controllable Core Sizes, 2009 Chem. Mater. 21 419-24.

Lee. D., et al., Viscoplastic and granular behavior in films of colloidal nanocrystals. Physical Review Letters, 2007, 98 (2).

Besra L et al., A review on fundamentals and applications of electrophoretic deposition (EPD), 2007 Prog. Mater. Sci. 52, 1-61.

Murray C B et al., Self-Organization of CdSe Nanocrystallites into Three-Dimensional Quantum Dot Superlattices, 1995, Science, 270 1335-8.

Sun, S.H., et al., Monodisperse FePt nanoparticles and ferro magnetic Fe Pt nanocrystal superlattices, Science, 2000, 287(5460), P1989.

B. Park et al., Capacitance characteristics of MOS capacitors embedded with colloidally synthesized gold nanoparticles, Semicond. Sci. Technol. 21, 975 (2006).

Castro Y et al., Coatings produced by electrophoretic deposition from nano-particulate silica sol-gel suspensions, 2004 Surf. Coat. Technol. 182 199-203.

S. A. Hasan et al., Electrophoretic deposition of CdSe nanocrystal films onto dielectric polymer thin films, Thin Solid Films, 517, 2665-2669 (2009).

Hamaker H C, Formation of a deposit by electro-Phoresis, 1939 Trans. Faraday Soc. 36, 279-87.

Lin, Y., et al., Ultra thin cross-linked nanoparticle membranes. Journal of the American Chemical Society, 2003, 125 (42), pp. 12690-12691.

Du C et al., Supercapacitors using carbon nanotubes films by electrophoretic deposition, 2006 J. Power Sources 160 1487-94.

R. Bazzi et al., Synthesis and luminescent properties of sub-5-nm lanthanide oxides nanoparticles, J. Lumin. 102, 445-450, (2003).

Ariga, K. et al., Layer-by-layer assembly as a versatile bottom-up nanofabrication techniqeu for exploratory research and realistic application, Physical Chemistry Chemical Physics, 2007, 9(19), pp. 2319-2340.

Park, J. et al., Ultra-large scale synthesis of monodisperse nanocrystals. Nature Materials, 2004, 3(12), pp. 891-895.

Lalatonne, Y. et al., Van der Waals versus dipolar forces controlling mesoscopice organizations of magnetic nanocrystals. Nature Materials, 2004, 3(2), pp. 121-125.

Shevchenko E. V. et al., Structural diversity in binary nanoparticle superlattices, 2006 Nature 439, 5, 55-59.

Coe, S, et al., Electroluminescence from single monolayer of nanocrystals in molecular organic devices, Nature, 2002, 420 (6917), 800-803.

Kong, J., et al. Synthesis of individual-single-walled carbon nanotubes on patterned silicon wafers. Nature, 1998, 395 (6705), pp. 878-881.

Mirkin C. A. et al., A DNA-based method for rationally assembling nanoparticles into macroscopic materials, 1996, Nature, 382, 15, 607-609.

S. V. Mahajan et al., Synthesis of monodisperse sub-3 nm RE2O3 and Gd2O3: RE3+ nanocrystals, Nanotechnology, 18, 325605 (2007).

S. V. Mahajan et al., Carbon nanotube-nanocrystal heterostructures fabricated by electrophoretic deposition, Nanotechnology, 19, 8 (2008).

Achermann, M. et al., 2006, Nanocrytsal-Based Light-Emitting Diodes Utilizing High Efficiency nanradiative energy Transfer for Color Conversion, Nano Letters, 2006, 6 (7), 1396-1400.

Islam M A et al., Addition, Suppression, and Inhibition in the Electrophoretic Deposition of Nanocrystal Mixture Films for CdSe Nanocrystals with y-Fe2O3 and Au Nanocrystals, 2003, Nano Lett., 3, 11, 1603-6.

Kitchell, J.P. et al., Poly(lactic Glycolic Acid) Biodegradable Drug Polymer Matrix Systems, Methods in Enzymology, 1985, 112, pp. 436-448.

Ferrari B. et al., Aqueous electrophoretic deposition of AL2O3/ZrO2 layered ceramics, 1998, Mater. Lett. 35, 370-374.

Tang F. et al., Electrophoretic deposition of aqueous nano-y-Al2O3 suspensions, 2002, Mater. Res. Bull., 37, 653-660.

Mamedov, A. A. et al., Free-standing layer-by-layer assembled films of magnetite nanoparticles. Langmuir, 2000, 16 (13), pp. 5530-5533.

Y. Liu et al., Charging mechanism in a SiO2 matrix embedded with Si nanocrystals, J. Appl. Phys., 100, 3 (2006).

S. Duguay et al., Structural and electrical properties of Ge nanocrystals embedded in SiO2 by ion implantation and annealing, J. Appl. Phys., 97, 5 (2005).

Kwo J. et al., Properties of high kappa gate dielectrics Gd2O3 and Y2O3 for Si, Journal of Applied Physics, 2001, 89, 3920-3927.

Y. Shi et al., Effects of traps on charge storage characteristics i metal-oxide-semiconductor memory structgures based on silicon nanocrystals, J. Appl. Phys., 84, 2358 (1998).

Cushing B. L. et al., Recent Advances in the Liquid-Phase Syntheses of Inorganic Nanoparticles, 2004, Chem. Rev. 104, 3893-946.

Morrison I. D., Electrical charges in nonaqueous media, 1993 Colloids Surf. A, 71, 1-37.

Mahajan S V et al., Carbon nanotube-nanocrystal heterostructures fabricated by electrophoretic deposition, Nanotechnology, 2008, 19, 195301.

Jung D et al., Influence of Dopants on the Suspension Properties and Reactive Electrophoretic Deposition (REPD), Key Engineering Materials, 2006, 314, 81-88.

Thomas B J C et al., Multi-Walled Carbon Nanotube Coatings Using Electrophoretic Deposition (EPD), J. Am. Ceram. Soc., 2005, 88, 4, 980-982.

Thomas B J C et al., Electrophoretic Deposition of Carbon Nanotubes on Metallic Surfaces, Key Eng. Mater., 2006, 314, 141-146.

Mahajan S V et al., Synthesis of monodisperse sub-3 nm RE2O3 and Gd2O3:RE3+ nanocrystals, Nanotechnology, 2007, 18, 325605.

De D et al., Role of Ionic Depletion in Deposition during Electrophoretic Deposition, J. Am. Ceram. Soc., 1999, 82, 11, 3031-36.

Sarkar P et al., Structural Ceramic Microlaminates by Electrophoretic Deposition, J. Am. Ceram. Soc., 1992, 75, 10, 2907-909.

Sarkar P et al., Zirconia/Alumina Functionally Gradiented Composites by Electrophoretic Deposition Techniques, J. Am. Ceram. Soc., 1993, 76, 4, 1055-56.

Sigmund W M et al., Novel Powder-Processing Methods for Advanced Ceramics, J. Am. Ceram. Soc., 2000, 83, 7, 1557-74.

Morrison I D et al., 2002, Colloidal Dispersions: Suspension, Emulsions, and Foams (New York: Wiley-Interscience).

Basu R N et al., Fabrication of Dense Zirconia Electrolyte Films for Tubular Solid Oxide Fuel Cells by Electrophoretic Deposition, J. Am. Ceram. Soc., 2001, 84, 1, 33-40.

Dieke G H, 1968, Spectra and Energy Levels of Rare Earth Ions in Crystals (New York: Wiley).

Wang Y C et al., Kinetics of Electrophoretic Deposition for Nanocrystalline Zinc Oxide Coatings, J. Am. Ceram. Soc., 2004, 87, 1, 84-88.

M. A. Islam et al., Electrodeposition of patterned CdSe nanocrystal films using thermally charged nanocrystals, Appl. Phys. Lett., 2002, 80, 20, 3823.

G. D. Scott et al., The density of random close packing of spheres, Brit. J. Phys. D-Appl. Phys., 1969, 2, 2, 863-866.

Shionoya S. et al., 1999, Phosphor Handbook (Boca Raton: CRC Press).

Blasse G. et al., 1994, Luminescent Materials (Berlin: Springer).

Hsu, T., MEMS & Microsystems Design and Manufacture, 2002, Mc-Graw Hill.

Park, J. et al., Ultra-large scale syntheses of monodisperse nanocrystals, Nature Materials, 2004, 3, 891-895.

Kendall, K., Adhesion: Molecules and Mechanics, Science, 1994, 263, 1720-1725.

DENSELY-PACKED FILMS OF LANTHANIDE OXIDE NANOPARTICLES VIA ELECTROPHORETIC DEPOSITION

CROSS-REFERENCE TO RELATED PATENT APPLICATION

This application is a continuation-in-part of U.S. patent application Ser. No. 12/587,401, filed on Oct. 5, 2009, entitled "Electrophoretic Fabricated Feedstranding All-Nanoparticle Thin Film Materials" by Saad Hasan and James Dickerson, which is incorporated herein by reference in its entirety.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference. In terms of notation, hereinafter, bracketed "n" represents the nth reference cited in the reference list. For example, [71] represents the 71st reference cited in the reference list, namely, [71] S. V. Mahajan and J. H. Dickerson, Nanotechnology 18, 325605 (2007).

FIELD OF THE INVENTION

The present invention relates generally to films of nanoparticles, in particular, to films of lanthanide oxide nanoparticles and methods of forming same.

BACKGROUND

Lanthanide oxides such as europium oxide ($Eu_2O_3$) and gadolinium oxide ($Gd_2O_3$) are known for their light emitting and high-K dielectric properties, respectively [76, 58, 77]. The $Eu^{3+}$-doped $Gd_2O_3$, in microcrystalline form, has been employed in video displays and tri-color fluorescent lamps as a red phosphor [78]. Recently, nanocrystalline form of $Eu^{3+}$-doped sesquioxides has gained research interest due to their potential use in luminescent biological tags, efficient light emitting devices, and high-resolution displays. $Gd_2O_3$ has received research attention because of its high-κ dielectric properties. $Gd_2O_3$ has been proposed as silicon dioxide replacement for gate oxide in ultra-small complementary metal-oxide-semiconductor (CMOS) devices [77]. Most applications of luminescent and dielectric materials require their implementation in thin-film form. The $Eu_2O_3$ and $Gd_2O_3$ nanocrystals, made via colloidal techniques, need to be assembled into thin-film form to study their optical and dielectric properties.

Therefore, a heretofore unaddressed need exists in the art to address the aforementioned deficiencies and inadequacies.

SUMMARY OF THE INVENTION

In one aspect, the present invention relates to a method of forming a film of lanthanide oxide nanoparticles. In one embodiment, the method includes the steps of: (a) providing a first substrate with a conducting surface and a second substrate that is positioned apart from the first substrate, (b) applying a voltage between the first substrate and the second substrate, (c) immersing the first substrate and the second substrate in a solution that comprises a plurality of lanthanide oxide nanoparticles suspended in a non-polar solvent or apolar solvent for a first duration of time effective to form a film of lanthanide oxide nanoparticles on the conducting surface of the first substrate, and (d) after the immersing step, removing the first substrate from the solution and exposing the first substrate to air while maintaining the applied voltage for a second duration of time to dry the film of lanthanide oxide nanoparticles formed on the conducting surface of the first substrate.

In one embodiment, the first substrate is gold-coated glass, gold-coated silicon, stainless steel (316L), indium-tin-oxide (ITO)-coated glass, or doped silicon.

In one embodiment, the applied voltage, V, is in the range of $0 \text{ volts} < V \leq 1000$ volts.

In one embodiment, the non-polar solvent or apolar solvent includes at least one of hexane, octane and mixtures thereof, and each of the first duration of time, T1 and the second duration of time voltage, T2, is in the range of $0 \text{ minutes} < T1, T2 \leq 30$ minutes.

In one embodiment, the first duration of time, T1 and the second duration of time voltage, T2, can be same or different.

In one embodiment, the solution has a concentration ranging from about $1 \times 10^{14}$ nanoparticles per cubic centimeter to about $10 \times 10^{15}$ nanoparticles per cubic centimeter.

In one embodiment, the film of lanthanide oxide nanoparticles formed on the conducting surface of the first substrate has a thickness ranging from about 50 to about 500 nm.

In one embodiment, the film of lanthanide oxide nanoparticles formed on the conducting surface of the first substrate has randomly close-packed lanthanide oxide nanoparticles with a packing density of about 66%.

In one embodiment, the lanthanide oxide nanoparticles are europium oxide ($Eu_2O_3$) nanoparticles or gadolinium oxide ($Gd_2O_3$) nanoparticles.

In yet another embodiment, the lanthanide oxide nanoparticles have a core diameter ranging from about 2 to about 3 nm.

In a further embodiment, the lanthanide oxide nanoparticles are surface-passivated with oleic acid.

In another aspect, the present invention provides an article of manufacture having a film of the lanthanide oxide nanoparticles made by the method set forth immediately above.

In yet another aspect, the present invention relates to a metal-oxide-semiconductor (MOS) capacitor. In one embodiment, the MOS capacitor has: (a) a silicon substrate having a first surface, (b) a film of lanthanide oxide nanoparticles formed on the first surface of the silicon substrate using the method set forth immediately above, and (c) an aluminum film formed on the film of lanthanide oxide nanoparticles, wherein the film of lanthanide oxide nanoparticles comprises randomly close-packed lanthanide oxide nanoparticles with a packing density of about 66%.

In one embodiment, the silicon substrate has p-type silicon.

In one embodiment, the first surface of the silicon substrate is a p−(100) surface of silicon.

In one embodiment, the MOS capacitor further has a film of silicon oxide disposed between the silicon substrate and the film of lanthanide oxide nanoparticles.

In one embodiment, the lanthanide oxide nanoparticles have europium oxide ($Eu_2O_3$) nanoparticles or gadolinium oxide ($Gd_2O_3$) nanoparticles.

In another embodiment, the film of lanthanide oxide nanoparticles has a thickness ranging from about 50 to about 500 nm.

In yet another embodiment, the aluminum film has a thickness of about 300 nm.

In a further embodiment, the aluminum film is formed on the film of lanthanide oxide nanoparticles using electron-beam evaporation.

These and other aspects of the present invention will become apparent from the following description of the preferred embodiment taken in conjunction with the following drawings and their captions, although variations and modifications therein may be affected without departing from the spirit and scope of the novel concepts of the disclosure.

DETAILED DESCRIPTION

Figure 1:
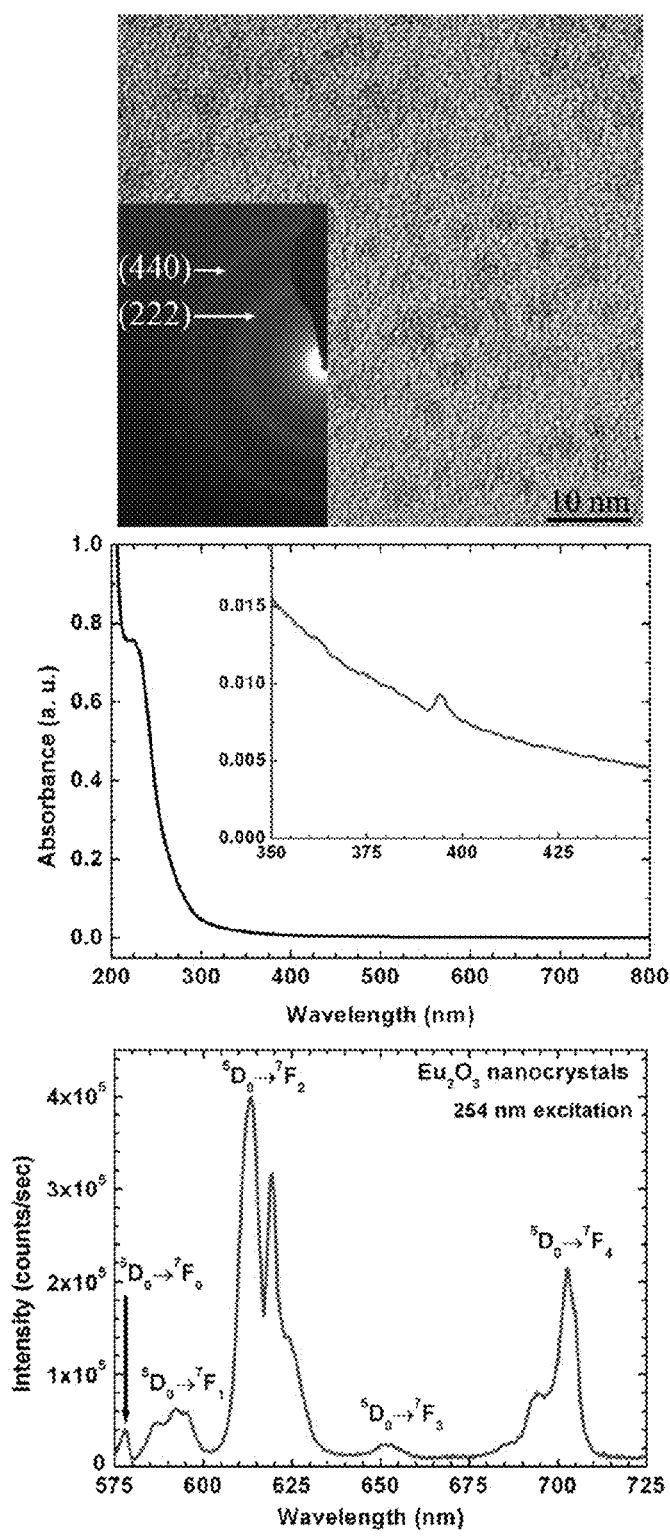
FIG. 1 shows: (a) TEM image of $Eu_2O_3$ nanocrystals, indicating an average diameter of about 2.4 nm; inset: electron diffraction pattern of the nanocrystals, exhibiting features arising from the {222} and {440} lattice planes; (b) absorption spectrum of the $Eu_2O_3$ nanocrystals, exhibiting strong absorption in UV region due to a transition from the ground state to the charge-transfer state of the Eu—O bond and (inset) a weak absorption peak at 395 nm due to the 4f→4f transition; and (c) photoluminescence spectrum of the nanocrystals, exhibiting peaks arising due to $^5D_0 \rightarrow ^7F_J$ (J=0-4) transitions.
Figure 2:
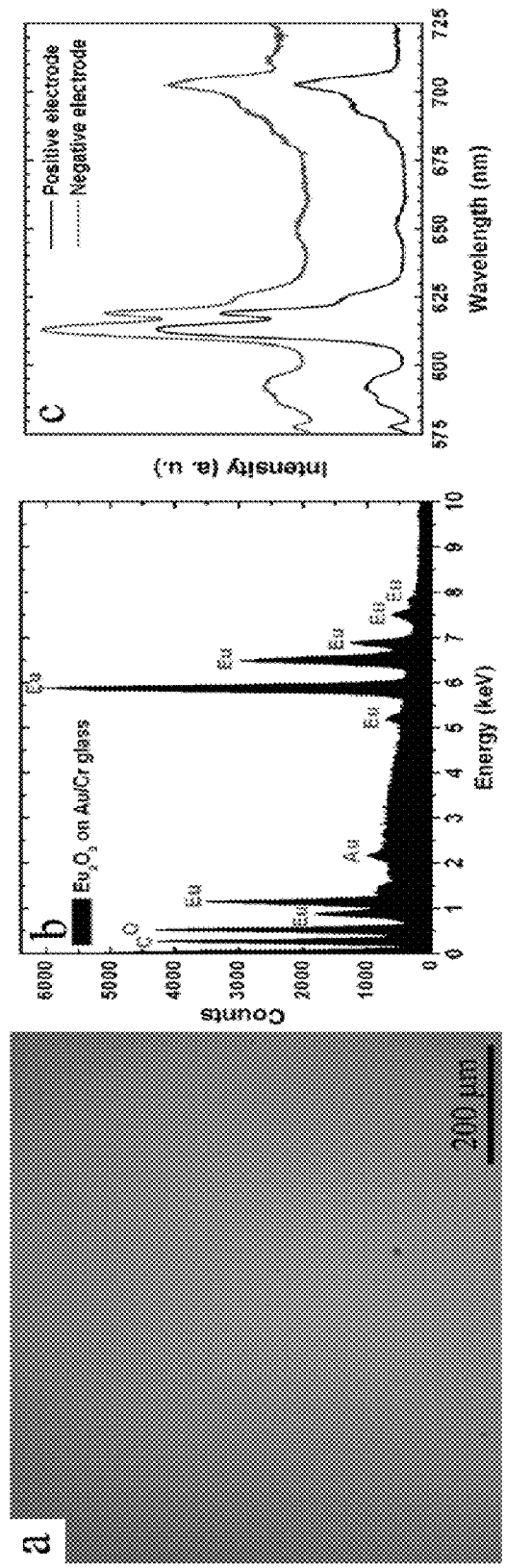
FIG. 2 shows: (a) optical micrograph of the $Eu_2O_3$ film deposited on a gold substrate, which appears golden in colour because of the background gold substrate and the high transparency of the film; (b) EDS spectrum of the film deposited on a gold substrate, which reveals the presence of europium, oxygen and carbon that originates from the oleic-acid-functionalized $Eu_2O_3$ nanocrystals and the gold from the substrate; and (c) PL spectra of the $Eu_2O_3$ nanocrystal films deposited on the anode and cathode. The spectra are identical to the spectrum of the $Eu_2O_3$ nanocrystals. PL spectra are shifted vertically for clarity.
Figure 3:
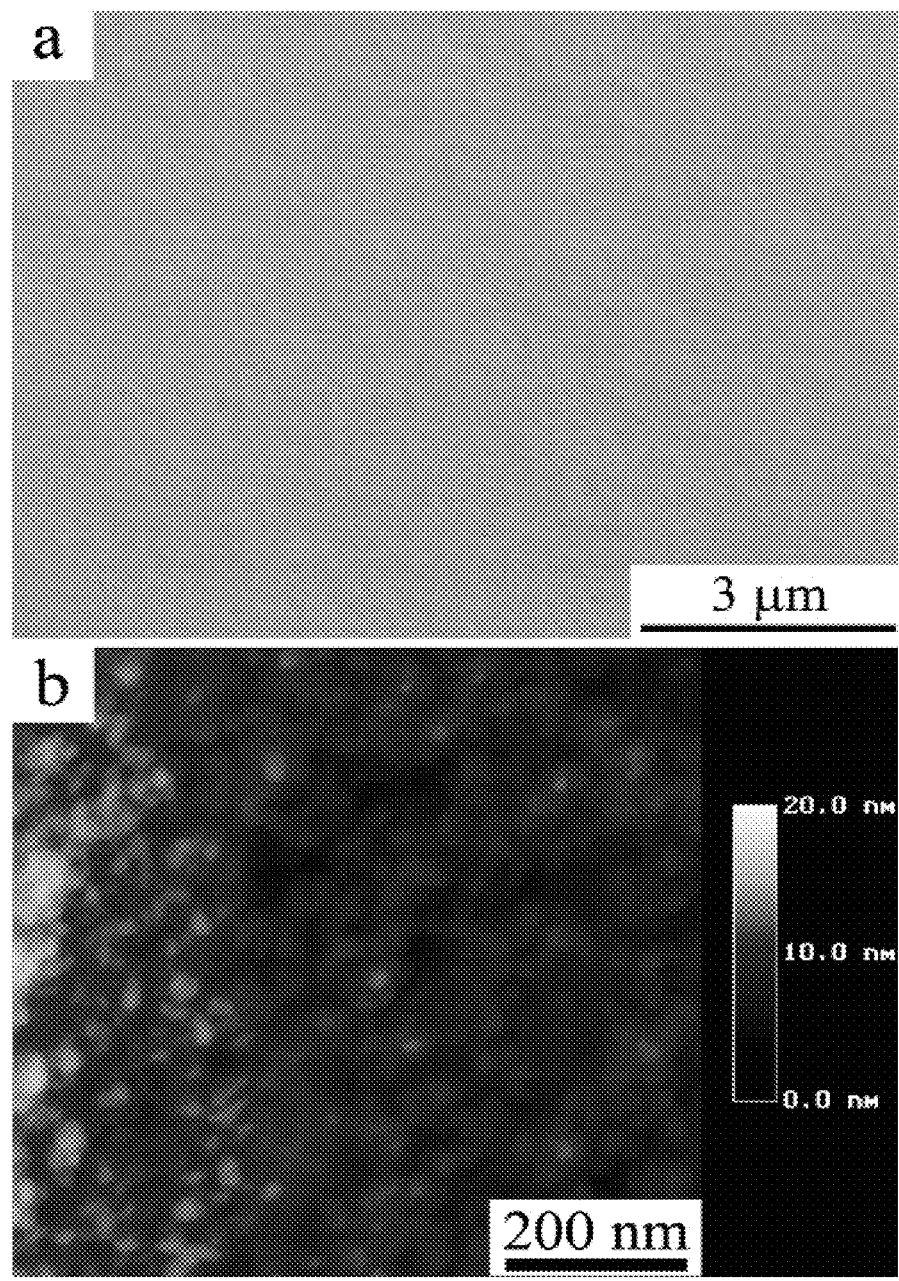
FIG. 3 shows: (a) SEM image of the nanocrystal film; and (b) AFM image of the nanocrystal film, which reveals deposition of the nanocrystal agglomerates of about 15 nm size. RMS roughness of the film determined from the AFM image is 1.4 nm.
Figure 4:
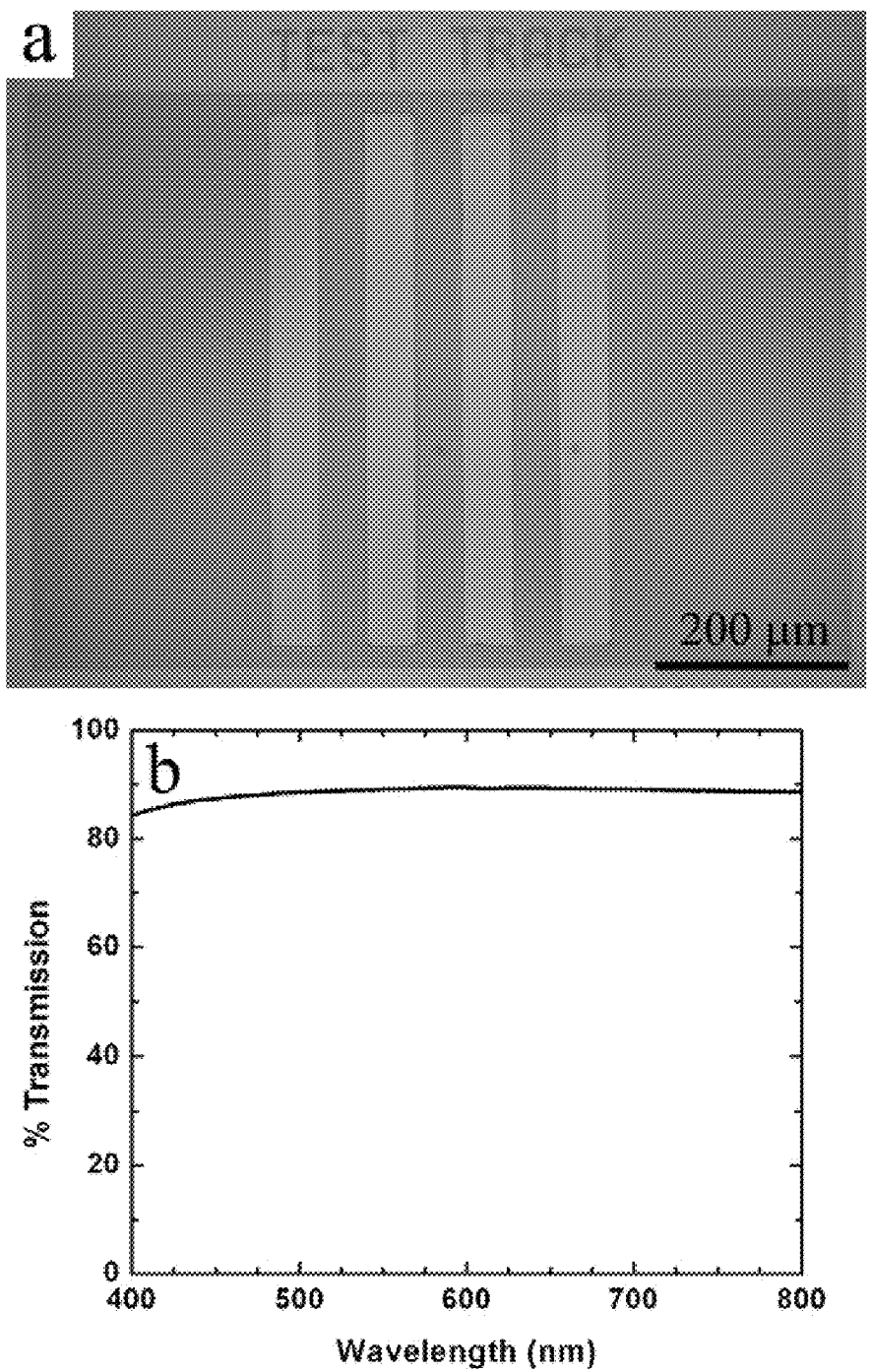
FIG. 4 shows: (a) optical micrograph of the patterned silicon substrate recorded through the nanocrystal film deposited on ITO-coated glass substrate, which reveals high transparency of the EPD film; and (b) transmission spectrum of a cast film of the $Eu_2O_3$ nanocrystals, showing high transparency in the visible region.

The present invention is more particularly described in the following examples that are intended as illustrative only since numerous modifications and variations therein will be apparent to those skilled in the art. Various embodiments of the invention are now described in detail. Referring to the drawings, FIGS. 1-11, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, if any, the term "atomic force microscope (AFM)" or scanning force microscope (SFM) refers to a very high-resolution type of scanning probe microscope, with demonstrated resolution of fractions of a nanometer, more than 1000 times better than the optical diffraction limit. The term "microscope" in the name of "AFM" is actually a misnomer because it implies looking, while in fact the information is gathered or the action is taken by "feeling" the surface with a mechanical probe. The AFM in general has a microscale cantilever with a tip portion (probe) at its end that is used to scan the specimen surface. The cantilever is typically silicon or silicon nitride with a tip radius of curvature on the order of nanometers. When the tip is brought into proximity of a sample surface, forces between the tip and the sample lead to a deflection of the cantilever according to Hooke's law. The AFM can be utilized in a variety of applications.

As used herein, if any, the term "transmission electron microscopy (TEM)" refers to a microscopy technique whereby a beam of electrons is transmitted through an ultra thin specimen, interacting with the specimen as it passes through it. An image is formed from the electrons transmitted through the specimen, magnified and focused by an objective lens and appears on an imaging screen, a fluorescent screen in most TEMs, plus a monitor, or on a layer of photographic film, or to be detected by a sensor such as a CCD camera.

As used herein, if any, the term "scanning electron microscope (SEM)" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, if any, the term "energy dispersive X-ray spectroscopy (EDS or EDX)" refers to an analytical technique used for the elemental analysis or chemical characterization of a sample. It is one of the variants of X-ray fluorescence spectroscopy which analyzes X-rays emitted by the matter in response to being hit with charged particles such as electrons or protons, or a beam of X-rays. Its characterization capabilities are due in large part to the fundamental principle that each element has a unique atomic structure allowing X-rays that are characteristic of an element's atomic structure to be identified uniquely from one another.

As used herein, if any, the term "absorption spectroscopy" refers to spectroscopic techniques that measure the absorption of radiation, as a function of frequency or wavelength, due to its interaction with a sample. The sample absorbs energy, i.e., photons, from the radiating field. The intensity of the absorption varies as a function of frequency, and this variation is the absorption spectrum. Absorption spectroscopy is employed as an analytical chemistry tool to determine the presence of a particular substance in a sample and, in many cases, to quantify the amount of the substance present. Infrared and ultraviolet-visible (UV-Vis) spectroscopy are particularly common in analytical applications. The term "infrared spectroscopy" refers to absorption spectroscopy in the infrared spectral region; and the term "ultraviolet-visible (UV-Vis) spectroscopy" refers to absorption spectroscopy in the ultraviolet-visible spectral region.

As used herein, if any, the term "photoluminescence spectroscopy" refers to a contactless, nondestructive method of probing the electronic structure of materials. In this method, light is directed onto a sample, where it is absorbed and imparts excess energy into the material in a process called photo-excitation. One way this excess energy can be dissipated by the sample is through the emission of light, or luminescence. In the case of photo-excitation, this luminescence is called photoluminescence. The intensity and spectral content of this photoluminescence is a direct measure of various important material properties.

As used herein, if any, the term "C-V", as in C-V profiling, or C-V measurements, or C-V characteristics, stands for capacitance-voltage, and refers to a technique used for characterization of semiconductor materials and devices. The technique uses a metal-semiconductor junction (Schottky barrier) or a p-n junction or a MOSFET to create a depletion region, a region which is empty of conducting electrons and holes, but may contain ionized donors and electrically active defects or traps. The depletion region with its ionized charges inside behaves like a capacitor. By varying the voltage applied to the junction it is possible to vary the depletion width. The dependence of the depletion width upon the applied voltage provides information on the semiconductor's internal characteristics, such as its doping profile and electrically active defect densities. Measurements may be done at DC, or using both DC and a small-signal AC signal (the conductance method), or using a large-signal transient voltage.

As used herein, the term "ITO" or "ITO glass" refers to indium tin oxide, or tin-doped indium oxide, which is a solid solution of indium(III) oxide ($In_2O_3$) and tin(IV) oxide ($SnO_2$), typically 90% $In_2O_3$, 10% $SnO_2$ by weight. It is transparent and colorless in thin layers while in bulk form it is yellowish to grey. In the infrared region of the spectrum it is a metal-like mirror. Indium tin oxide is one of the most widely used transparent conducting oxides and so has main feature of a combination of electrical conductivity and optical transparency. Thin films of indium tin oxide are most commonly deposited on surfaces by electron beam evaporation, physical vapor deposition, or a range of sputter deposition techniques.

As used herein, "nanoscopic-scale," "nanoscopic," "nanometer-scale," "nanoscale," "nanocomposites," "nanoparticles," the "nano-" prefix, and the like generally refers to elements or articles having widths or diameters of less than about 1 μm, preferably less than about 100 nm in some cases. In all embodiments, specified widths can be smallest width (i.e. a width as specified where, at that location, the article can have a larger width in a different dimension), or largest width (i.e. where, at that location, the article's width is no wider than as specified, but can have a length that is greater).

As used herein, "plurality" means two or more.

As used herein, the terms "comprising," "including," "carrying," "having," "containing," "involving," and the like are to be understood to be open-ended, i.e., to mean including but not limited to.

OVERVIEW OF THE INVENTION

Lanthanide oxides such as europium oxide ($Eu_2O_3$) and gadolinium oxide ($Gd_2O_3$) are known for their light emitting and high-κ dielectric properties, respectively [76, 58, 77]. The $Eu^{3+}$-doped $Gd_2O_3$, in microcrystalline form, has been employed in video displays and tri-color fluorescent lamps as a red phosphor [78]. Recently, nanocrystalline form of $Eu^{3+}$-doped sesquioxides has gained research interest due to their potential use in luminescent biological tags, efficient light emitting devices, and high-resolution displays. $Gd_2O_3$ has received research attention because of its high-κ dielectric properties. $Gd_2O_3$ has been proposed as silicon dioxide replacement for gate oxide in ultra-small complementary metal-oxide-semiconductor (CMOS) devices [77]. Most applications of luminescent and dielectric materials require their implementation in thin-film form. The $Eu_2O_3$ and $Gd_2O_3$ nanocrystals, made via colloidal techniques, need to be assembled into thin-film form to study their optical and dielectric properties. Of the thin-film deposition techniques, electrophoretic deposition (EPD) is the promising technique to deposit nanomaterials. EPD offers a simple design set-up and provides substantial thickness control at high deposition rates to assemble particles site-selectively of any size and shape.

In one embodiment of the present invention, EPD technique is employed to deposit ultra-small (<3 nm) colloidal lanthanide oxide nanoparticles, specifically $Eu_2O_3$ and $Gd_2O_3$ nanocrystals, to form uniform, homogeneous films. The nanocrystals were synthesized via hot solution phase method and purified with ethanol prior to deposition [71]. The films were deposited onto conducting substrates such as gold-coated glass, gold-coated silicon, stainless steel (316L), indium-tin-oxide-coated (ITO) glass, and p-type silicon from a suspension of the nanocrystals in hexane.

A typical EPD involves the following sequence of the steps: application of a DC voltage to a pair of electrodes, insertion of the pair of electrodes into the EPD suspension (area: about 18 mm×13 mm), deposition for 15 min, and extraction of the pair of electrodes from the suspension, and drying in air for 5 min while maintaining the applied voltage. The films of different thicknesses were deposited employing different nanocrystal suspension concentrations (about 1-10× $10^{15}$ NC/cc) and different applied voltages (about 250-1000 V).

Thus, in one aspect, the present invention provides a method of forming a film of lanthanide oxide nanoparticles. In one embodiment, the method comprises the steps of: (a) providing a first substrate with a conducting surface and a second substrate that is positioned apart from the first substrate, (b) applying a voltage between the first substrate and the second substrate, (c) immersing the first substrate and the second substrate in a solution that comprises a plurality of lanthanide oxide nanoparticles suspended in a non-polar solvent or apolar solvent for a first duration of time effective to form a film of lanthanide oxide nanoparticles on the conducting surface of the first substrate, and (d) after the immersing step, removing the first substrate from the solution and exposing the first substrate to air while maintaining the applied voltage for a second duration of time to dry the film of lanthanide oxide nanoparticles formed on the conducting surface of the first substrate.

In one embodiment, the first substrate is gold-coated glass, gold-coated silicon, stainless steel (316L), indium-tin-oxide (ITO)-coated glass, or doped silicon.

In one embodiment, the applied voltage, V, is in the range of 0 volts<V≦1000 volts.

In one embodiment, the non-polar solvent or apolar solvent includes at least one of hexane, octane and mixtures thereof, and each of the first duration of time, T1 and the second duration of time voltage, T2, is in the range of 0 minutes<T1, T2≦30 minutes.

In one embodiment, the first duration of time, T1 and the second duration of time voltage, T2, can be same or different.

In one embodiment, the solution has a concentration ranging from about $1\times10^{14}$ nanoparticles per cubic centimeter to about $10\times10^{15}$ nanoparticles per cubic centimeter.

In one embodiment, the film of lanthanide oxide nanoparticles formed on the conducting surface of the first substrate has a thickness ranging from about 50 to about 500 nm.

In one embodiment, the film of lanthanide oxide nanoparticles formed on the conducting surface of the first substrate comprises randomly close-packed lanthanide oxide nanoparticles with a packing density of about 66%.

In one embodiment, the lanthanide oxide nanoparticles are europium oxide ($Eu_2O_3$) nanoparticles or gadolinium oxide ($Gd_2O_3$) nanoparticles.

In yet another embodiment, the lanthanide oxide nanoparticles have a core diameter ranging from about 2 to about 3 nm.

In a further embodiment, the lanthanide oxide nanoparticles are surface-passivated with oleic acid.

In another aspect, the present invention provides an article of manufacture having a film of the lanthanide oxide nanoparticles made by the method set forth immediately above.

In yet another aspect, the present invention provides a metal-oxide-semiconductor (MOS) capacitor. In one embodiment, the MOS capacitor has: (a) a silicon substrate having a first surface, (b) a film of lanthanide oxide nanoparticles formed on the first surface of the silicon substrate using the method set forth immediately above, and (c) an aluminum film formed on the film of lanthanide oxide nanoparticles, wherein the film of lanthanide oxide nanoparticles comprises randomly close-packed lanthanide oxide nanoparticles with a packing density of about 66%.

In one embodiment, the silicon substrate has p-type silicon.

In one embodiment, the first surface of the silicon substrate is a p-(100) surface of silicon.

In one embodiment, the MOS capacitor further has a film of silicon oxide disposed between the silicon substrate and the film of lanthanide oxide nanoparticles.

In one embodiment, the lanthanide oxide nanoparticles include europium oxide ($Eu_2O_3$) nanoparticles or gadolinium oxide ($Gd_2O_3$) nanoparticles.

In another embodiment, the film of lanthanide oxide nanoparticles has a thickness ranging from about 50 to about 500 nm.

In yet another embodiment, the aluminum film has a thickness of about 300 nm.

In a further embodiment, the aluminum film is formed on the film of lanthanide oxide nanoparticles using electron-beam evaporation.

Additional details are set forth below.

EXAMPLES

Aspects of the present teachings may be further understood in light of the following examples, which should not be construed as limiting the scope of the present teachings in any way.

Example 1

$Eu_2O_3$ Nanocrystal Films.

The controlled assembly of nanomaterials into microscopic and macroscopic structures is one of the most important and continuously growing research directions in nanotechnology. Efficient bottom-up assembly approaches are essential to the development of next-generation optical, magnetic and electronic devices that utilize the unique properties of metallic, semiconducting or insulating nanomaterials. Currently employed nanomaterial assembly techniques include drop-casting, spin-casting [1], self-assembly [2-4], Langmuir-Blodgett [5, 6] and electrophoretic deposition (EPD) [7-9]. For an assembly technique to be commercially or industrially viable for the fabrication of nanostructured devices, the technique must involve flexibility of the type of material (metal/semiconductor/insulator), superior film thickness control, high rate of assembly and site-selectivity. Of the aforementioned deposition techniques, electrophoretic deposition is arguably the most promising for nanomaterial deposition, as EPD offers a simple design set-up and provides substantial thickness control at rapid deposition rates to assemble site-selectively particles of any size, shape and type [10]. EPD has been employed successfully to deposit films of metallic (Au, Pt) [11, 12], semiconducting (CdSe, ZnO) [7, 13], insulating ($TiO_2$, $SiO_2$, $Eu_2O_3$) [14-18] and magnetic ($Fe_3O_4$, $Fe_2O_3$) [9, 19] nanocrystals. Other types of nanomaterials, such as polymer nanoparticles [20, 21] and carbon nanotubes (CNTs) [9, 22-27], have been assembled_via EPD. Homogeneous and smooth films of nanocrystals have been reported for the nanocrystals functionalized with surface capping ligands such as CdSe, $Fe_2O_3$, $Fe_3O_4$ and $Eu_2O_3$ [7, 9, 16, 28]. Such nanocrystals form stable suspensions in non-polar solvents such as hexane because of the hydrophobic surface capping ligands, often used in colloidal nanocrystal syntheses to stabilize the surface of the nanocrystals [29-31]. Surface-stabilized $Eu_2O_3$ nanocrystal films have been of recent interest because of their strong ultraviolet (UV) absorption and the characteristic red colour emission of the nanocrystals [31]. $Eu_2O_3$ nanocrystal films have potential applications in UV absorption coatings, photoactive coatings and fluorescent screens [32, 33]. In these applications, the deposition of transparent films facilitates the efficient transmission of visible light. Since $Eu_2O_3$ nanocrystals have weak absorption in the visible, implementation of small-diameter, light-emitting nanocrystals should minimize light scattering losses and thereby enhance the transmission of light throughout the visible spectrum.

The relationship among the film thickness, the EPD suspension parameters (particle mobility) and the EPD process parameters (applied voltage, deposition time and nanocrystal concentration) was originally studied by Hamaker [34]. Later, the effect of these parameters on the deposition of various micron-sized ceramic particles ($Al_2O_3$, $TiO_2$, $SiO_2$) from their suspension in water and organic polar solvents was investigated [14, 15, 23, 35-40]. In contrast, research exploring the deposition of nanocrystals that are suspended in non-polar organic solvents (hexane) is relatively limited [7, 9, 19, 41]. Since the EPD suspension properties are dependent on the suspension medium, the properties for nanocrystals suspended in non-polar solvents differ from those of particles suspended in water and organic polar solvents. Nanocrystals with surface capping ligands form stable suspension in non-polar solvent (e.g. hexane) because of the steric stabilization of the nanocrystal surface with ligands. Steric repulsive forces, developed between the nanocrystals by the ligands, overcome the van der Waals attraction forces to form the stable suspension [42]. The origin of surface charges in sterically stabilized nanocrystal suspensions also differs from that of electrostatically stabilized particles in suspension. In electrostatically stabilized systems, surface charges develop because of polar solvent molecules and free ions in the solvent [43, 44]. In contrast, the charges on the larger nanocrystals may originate from the adsorption of uncharged ligands, ion exchange between the adsorbed ligand and the surface, and desorption of the ionized ligands [45-47]. Thermal charging of nanocrystals in suspension has been another debated origin of charge [28, 48]. However, our most substantive concern regarding surface charge arises from charge tuning on the nanocrystals achieved through the addition of ligands and/or removal of ligands via purification steps [2]. Since a fraction of the ligands is detached during each step of nanocrystal purification, the nanocrystal surface charge can become changed. The effect of the number of nanocrystal purification steps on the quality of electrophoretically deposited CdSe nanocrystal films has been reported, which provides a considerable insight into the optimization of film quality [41]. Although studies have been conducted on the effect of EPD process parameters on the quality of films composed of micron-sized (or larger) electrostatically stabilized particles [49, 50], no specific report, to date, exists exploring the effect of EPD process parameters on the quality of sterically stabilized or electrostatically stabilized nanocrystalline films.

In various embodiments of the present invention, certain transparent films of $Eu_2O_3$ nanocrystals were fabricated via electrophoretic deposition and investigated the effect of EPD processing parameters (applied voltage, deposition time and nanocrystal concentration) on the uniformity of the films. About 2.4 nm $Eu_2O_3$ nanocrystals that were capped with oleic acid and were suspended in a non-polar solvent or apolar solvent such as hexane were employed. The films were deposited onto two types of substrates: gold-coated glass and indium-tin-oxide (ITO)-coated glass. The deposition of the nanocrystals on the anode and cathode was confirmed by conducting elemental analysis via energy dispersive spectroscopy (EDS) and optical analysis using photoluminescence spectroscopy (PL). Scanning electron microscopy (SEM) and atomic force microscopy (AFM) confirmed the deposition of homogeneous, topographically smooth films that were composed of densely packed agglomerates (about 15 nm) of the $Eu_2O_3$ nanocrystals. Additionally, the effect of EPD processing parameters on the thickness and uniformity of the transparent films were explored. The effect that these parameters had on the thickness homogeneity across the film provided a marked insight into the growth mechanisms of the films.

Nanocrystal Synthesis and Purification.

Europium oxide ($Eu_2O_3$) nanocrystals were synthesized via a two-stage solution-phase technique, as described in detail by the inventors elsewhere [31]. In the first stage, europium oleate was synthesized by heating a mixture of europium (III) chloride hexahydrate ($EuCl_3.6H_2O$) and sodium oleate ($CH_3(CH_2)_7CH:CH(CH_2)_7COONa$) at 70° C. for 4 hours in a hexane-ethanol-water mixture. Next, a mixture of europium oleate (0.5 mM) and oleic acid (0.25 mM) was heated to 350° C. in tri-n-octylamine (7 ml) and maintained at that temperature for an hour during the second stage. This synthesis yielded $Eu_2O_3$ nanocrystals of 2.4±0.3 nm core diameter, surface-passivated with oleic acid. The nanocrystals were isolated from the reaction mixture by a purification process that involved sequential precipitation and centrifugation sequences. The addition of ethanol to the reaction mixture facilitated nanocrystal precipitation; centrifugation helped to isolate the nanocrystals. The isolated nanocrystals were dispersed back into hexane and the precipitation-centrifugation sequence was repeated. The nanocrystals, purified four times (4×) by this procedure, were employed for transmission electron microscopy (TEM) imaging. The nanocrystals were purified further (10×) to deposit the optimum quality film. The final nanocrystal suspensions for employment in electrophoretic deposition were prepared in hexane.

Electrophoretic Deposition (EPD).

The EPD technique was used to deposit $Eu_2O_3$ nanocrystals onto two types of substrate: gold-coated glass (gold electrode) and indium-tin-oxide-coated glass (ITO electrode).

Gold electrodes were fabricated by the thermal evaporation of about 20 nm of chromium, used as an adhesion layer, onto a glass substrate followed by about 125 nm of gold. ITO electrodes (surface-resistant: 15-25Ω) were purchased from Delta Technologies, Ltd. The electrodes were cut to the size of 25 mm×13 mm for EPD. Then, the electrodes were cleaned sequentially using acetone, ethanol and hexane with an intermediate drying step using a stream of nitrogen. The electrodes were mounted in a vertical parallel-plate configuration with a gap of about 5 mm. For a single EPD, a pair of the same type of substrate was employed as the positive and negative electrodes. A Keithley 6517A electrometer was utilized to apply DC bias to the electrodes and to measure current flowing through the suspension during the deposition. A typical EPD involved the following sequence: application of a DC voltage, insertion of an electrode pair into the EPD suspension (deposition area: about 18 mm×13 mm), deposition for 15 minutes, and extraction of the electrode pair from the suspension and drying in air for 5 minutes while maintaining the applied voltage.

Characterization.

The size of the $Eu_2O_3$ nanocrystals was measured from the image of the nanocrystals, acquired with a Philips CM 20 transmission electron microscope. The absorption and photoluminescence spectra of the nanocrystal suspensions were recorded using a Cary 5000 spectrophotometer and a Fluorolog-3-FL3-111 spectrophotofluorometer, respectively. Electrophoretic mobility of the nanocrystals was measured in suspension (hexane) from dynamic light scattering (DLS) experiments, performed on a Malvern Nano ZS system. Optical micrographs of the nanocrystal films were acquired with a Leitz microscope connected to a CFM-USB-2 camera from Angstrom Sun Technologies Inc. Surface morphologies of the films were analysed using a Hitachi S-4200 scanning electron microscope and a Digital Instruments Nanoscope III atomic force microscope in tapping mode. Deposition of the nanocrystals on the electrodes was confirmed by performing elemental analysis of the electrodes using energy dispersive spectroscopy with a Link ISIS Series 300 microanalysis system (Oxford Instruments). Film thickness using a Veeco Dektak 150 surface profiler was measured. The transmission and photoluminescence spectra of the nanocrystal films were acquired using a Cary 5000 spectrophotometer and a Fluorolog-3-FL3-111 spectrophotofluorometer, respectively.

Results and Implications.

FIG. 1 shows a TEM image and electron diffraction pattern of the $Eu_2O_3$ nanocrystals, and absorption and PL spectra of the nanocrystals that were dispersed in hexane. The average core diameter of the $Eu_2O_3$ nanocrystals was $d_{NC}$=2.4±0.3 nm, confirmed with the TEM image (as shown in FIG. 1(a). Shown as an inset to FIG. 1(a), an electron diffraction pattern of the nanocrystals revealed features attributable to the {222} and {440} lattice planes of $Eu_2O_3$. FIG. 1(b) shows the absorption spectrum of the nanocrystals. The nanocrystals exhibited strong absorption in the ultraviolet (UV) region but showed weak absorption in the visible region. The strong absorption peak at 225 nm was attributed to the transition between the ground state and the charge-transfer state of the Eu—O bond ($4f^7 \rightarrow 4f^72p^{-1}$) [51-53]. In addition, the weak absorption peak at 395 nm, shown in the inset to FIG. 1(b), arose from the 4f→4f transition [51]. FIG. 1(c) shows the photoluminescence spectrum of the nanocrystals upon UV excitation (254 nm). The peaks corresponded to the $^5D_0 \rightarrow ^7F_J$ (J=0-4) radiative energy transitions within $Eu^{3+}$ ions [31]. Of these characteristic transitions, the $^5D_0 \rightarrow ^7F_2$ is the most sensitive transition to the location of the $Eu^{3+}$ ion within the crystal. The most intense PL peaks (612, 620 and 624 nm) were observed [31].

Known for its production of high quality films of colloidal nanocrystals, EPD was implemented to deposit the $Eu_2O_3$ nanocrystals from their suspension in hexane [9, 54]. Nanocrystal films were deposited on gold and ITO electrodes. FIG. 2(a) shows a typical optical micrograph of a $Eu_2O_3$ nanocrystal film, deposited on a gold electrode (anode). The nanocrystal film was cast with an applied voltage of 250 V and a nanocrystal concentration of $2 \times 10^{15}$ NC $cm^{-3}$. The yellowish colour of the film is due to its high transparency and the colour of the underlying gold substrate. The film was continuous with no visible defects larger than 5 μm. The film that was deposited on the cathode had a comparable appearance. The thickness of the film was about 110 nm, which was measured using surface profilometry. To verify deposition of $Eu_2O_3$ nanocrystals on the electrodes, EDS was performed for elemental analysis and PL for optical analysis. FIG. 2(b) shows the EDS spectrum of the nanocrystal film, deposited on the anode. The presence of europium, oxygen and carbon peaks confirmed the deposition of the oleic-acid-functionalized $Eu_2O_3$ nanocrystals. Also, gold was detected because of the underlying gold substrate. Similarly, deposition of the $Eu_2O_3$ nanocrystals was confirmed on the cathode. FIG. 2(c) shows the PL spectra of the anode and cathode upon UV excitation (254 nm). The spectra exhibited all of the peaks corresponding to the $^5D_0 \rightarrow ^7F_J$ (J=0-4) energy transitions of the $Eu^{3+}$ ion. The spectra were identical to the spectrum of the $Eu_2O_3$ nanocrystals (as shown in FIG. 1(c), confirming deposition of the $Eu_2O_3$ nanocrystals. Thus, the EDS and PL spectra of cathode and anode confirmed deposition of the $Eu_2O_3$ nanocrystal film.

Surface morphology of the nanocrystal film was probed with SEM and AFM. FIG. 3(a) shows the SEM image of the nanocrystal film, deposited on the anode. The nanocrystal film was topographically smooth and uniform. The film on the cathode had comparable surface morphology. AFM was employed to perform high-resolution surface topological analysis of the nanocrystal film. The AFM image, shown in FIG. 3(b), revealed that the film was composed of agglomerates of the $Eu_2O_3$ nanocrystals, approximately 15-20 nm in diameter. The apparent deposition of agglomerates of the nanocrystals instead of individual nanocrystals motivated us to identify the formation of any agglomerates in EPD suspension prior to the deposition. New TEM samples were prepared for imaging by drop-casting the EPD suspensions onto the grids. These new samples confirmed the absence of any agglomerates of the $Eu_2O_3$ nanocrystals in the EPD suspension. Thus, the agglomeration of the nanocrystals likely occurred under the influence of the electric field during EPD. The agglomeration may have occurred at one or more of the following stages: (a) immediate agglomeration upon application of the voltage to the electrodes in the EPD suspension; (b) agglomeration near the electrodes following an increase in the nanocrystal concentration due to movement of charged nanocrystals towards the respective electrodes and (c) reorganization of the deposited nanocrystals at the electrode leading to agglomeration. Even though the nanocrystals agglomerated under the influence of an electric field, the extent of agglomeration was limited because of sufficient ligand coverage on the nanocrystal surface. The deposited agglomerates packed close to each other, forming a continuous and densely arranged film (as shown in FIG. 3(b). It was reported a packing fraction of about 0.63 for random close packing, also known as glassy packing, of spheres [55]. The observed packing fraction (about 0.56) by practicing the present invention was calculated on the basis of the AFM image and was within the lower regime of glassy packing Nonetheless, these films were particularly smooth. The root mean square (RMS) surface roughness, determined from the AFM image of the film, was about 1.4 nm, which was smaller than the diameter of one nanocrystal. The two plausible reasons for the high smoothness of the films are: (a) a small fraction of the nanocrystals was deposited along with the agglomerates of the nanocrystals and (b) the agglomerates of the nanocrystals had a degree of structural flexibility since the nanocrystal surface was partially covered with 'soft' surface capping ligands. Thus, SEM and AFM imaging confirmed the formation of a smooth, uniform and densely packed film of the agglomerates of the $Eu_2O_3$ nanocrystals.

To demonstrate transparency of the $Eu_2O_3$ nanocrystal film, an optical micrograph of the patterned silicon substrate was recorded through the nanocrystal film that was deposited on the ITO electrode (as shown in FIG. 4(a). The patterned substrate was clearly visible, which confirmed the formation of highly transparent film. Transmission spectroscopy was performed on the same film to determine its transmission properties in the visible region. Intensity oscillations of transmitted light were seen in the visible transmission spectrum, which were due to Bragg interference because of the thickness of the film (about 110 nm thick). To measure the transmission of the film, an about 500 μm film was deposited using a drop-cast technique. FIG. 4(b) shows the transmission spectrum of the drop-cast film, which reveals high transparency in the visible region (>80%). Considering the high transparency of the thick film, the electrophoretically deposited thin film should have a comparable transmission. High transparency of the film was achieved by minimizing the scattering loss of visible light within the nanocrystal film. The intensity of scattered light off a nanoparticle within the visible region is best expressed by the Rayleigh scattering equation, which is appropriate within the limit $x=\pi d_{NC}/\lambda$, $x \ll 1$. For the average size (15 nm) of agglomerates of the $Eu_2O_3$ nanocrystals, x ranges between 0.12 and 0.06 in the visible spectral region. Since the nanocrystal films had a transparent appearance instead of hazy (e.g. translucent), the use of Rayleigh scattering theory instead of Mie scattering theory is valid. Rayleigh scattering intensity per particle, $I_S$, is written as $$I_S = \left(\frac{2\pi}{\lambda}\right)^4 \left(\frac{n^2-1}{n^2+2}\right)^2 \left(\frac{1+\cos^2\theta}{2R^2}\right)\left(\frac{d_{NC}}{2}\right)^6 I_0 \quad (1)$$

where $\lambda$ is the wavelength of the incident light, n is the refractive index of the particle, $\theta$ is the scattering angle, R is the distance to the particle from the point of observation, $d_{NC}$ is the particle diameter and $I_0$ is the intensity of the incident light. Clearly, the small size of the $Eu_2O_3$ nanocrystal agglomerates within the film facilitated reduction of the scattering loss of visible light because the scattering intensity is proportional to the sixth power of the particle size. Thus, the small size of the $Eu_2O_3$ nanocrystal agglomerates was the key to achieving highly transparent films.

The ability to control the thickness of the films made according to the various embodiments of the present invention is extremely important while maintaining film quality. The Hamaker equation (2) correlates the amount of particles deposited (deposit yield, w) during EPD to the electrophoretic mobility (μ), the electric field (E), the electrode area (A), the particle mass concentration in the suspension (C) and the deposition time (t):

$$w = \mu E A C t \quad (2)$$

The electrophoretic mobility (μ) of the particles, suspended in low-dielectric solvents, is related to the zeta potential of the particle (ζ), the solvent viscosity (η), relative permittivity of the solvent ($\epsilon_r$) and the permittivity of vacuum ($\epsilon_0$) of the suspension through the Hückel equation (3):

$$\mu = \frac{2\epsilon_0 \epsilon_r \zeta}{3\eta} \quad (3)$$

The deposition yield, as stated by the Hamaker equation, is written as $$w = \frac{2\epsilon_0 \epsilon_r \zeta E A C t}{3\eta} \quad (4)$$

Since the solvent (hexane) and electrode set-up (deposition area, A=18 mm×13 mm, 5 mm gap) for EPD were the same, the parameters ($\epsilon_r$, η and A) remained constant. The number of purification steps, employed to purify the nanocrystals, affected the coverage of surface capping ligands on the nanocrystals. Net charges possessed by the nanocrystals in solution are related to the coverage of ligands on the nanocrystal surface (steric stabilization). Hence, the $Eu_2O_3$ nanocrystals in solution were purified by the same process to maintain a similar zeta potential of the nanocrystals for all EPDs. Thus, the deposition yield (and film thickness) can be controlled via the EPD process parameters such as the electric field (E), the particle concentration (C) and the deposition time (t). For a deposition sequence with a constant applied voltage and a fixed initial concentration, the deposition rate decreases as the deposition time increases [56]. A decreasing particle concentration within the EPD suspension and an increasing voltage drop across the growing film of insulating/semiconducting nanoparticles also decreases the deposition rate for extended deposition times. It was reported that the current density and deposition rate of hydroxyapatite decreased as a function of deposition time [57]. A decreasing current density through the particle suspension is an indication of a decreasing deposition rate. It has been observed that the current density through the $Eu_2O_3$ nanocrystal suspension prepared according to various embodiments of the present invention dropped at least 80% within ten minutes of the beginning of the deposition run. Since the deposition rate was expected to be low at times beyond fifteen minutes of deposition time, the deposition time fixed at 15 minutes was maintained for all EPD experiments and the applied voltage and the nanocrystal concentration was varied to monitor the uniformity and thickness of the films.

Figure 5:
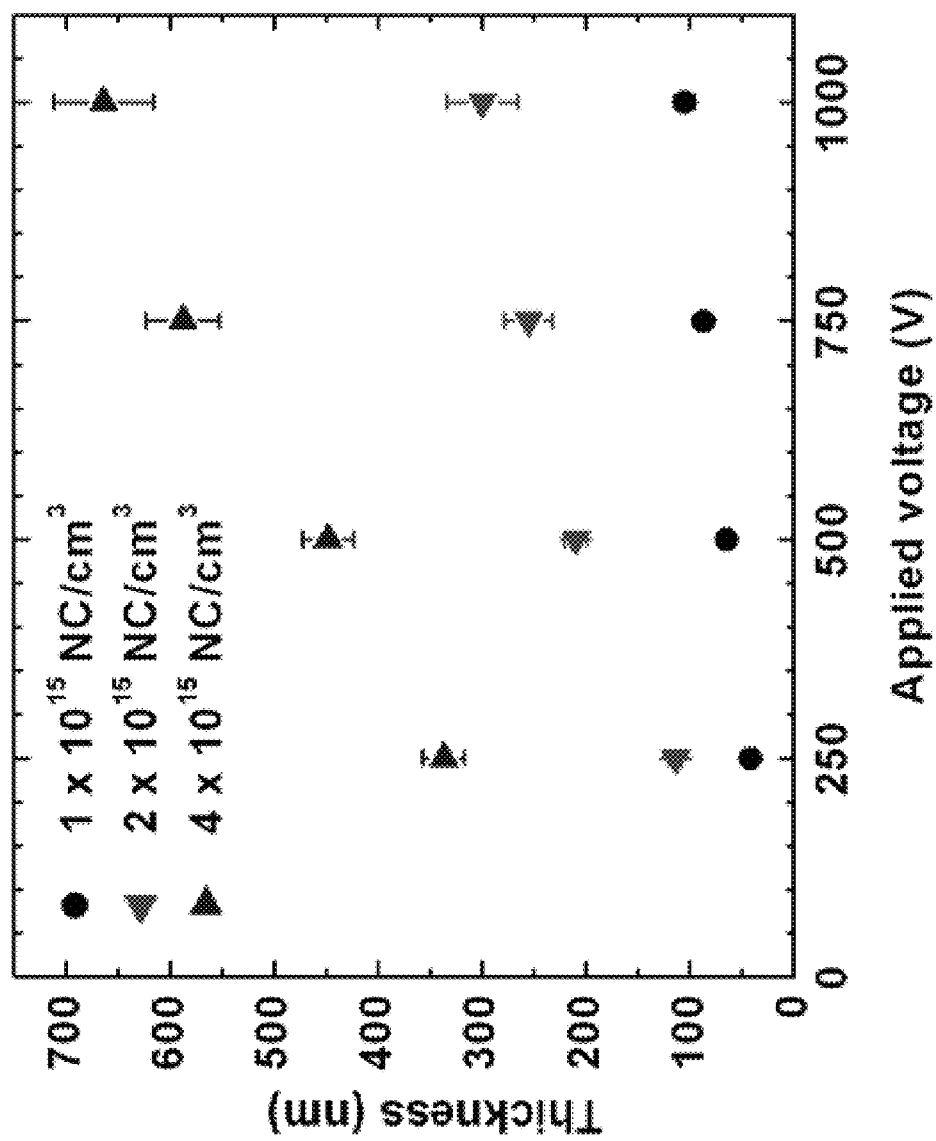
FIG. 5 shows the thickness of the EPD film as a function of the applied voltage for different nanocrystal concentrations. Average film thickness is reported from the thickness measurements at different locations and standard deviation is employed as the error bar. The large error bar indicates decreased film uniformity.
Figure 6:
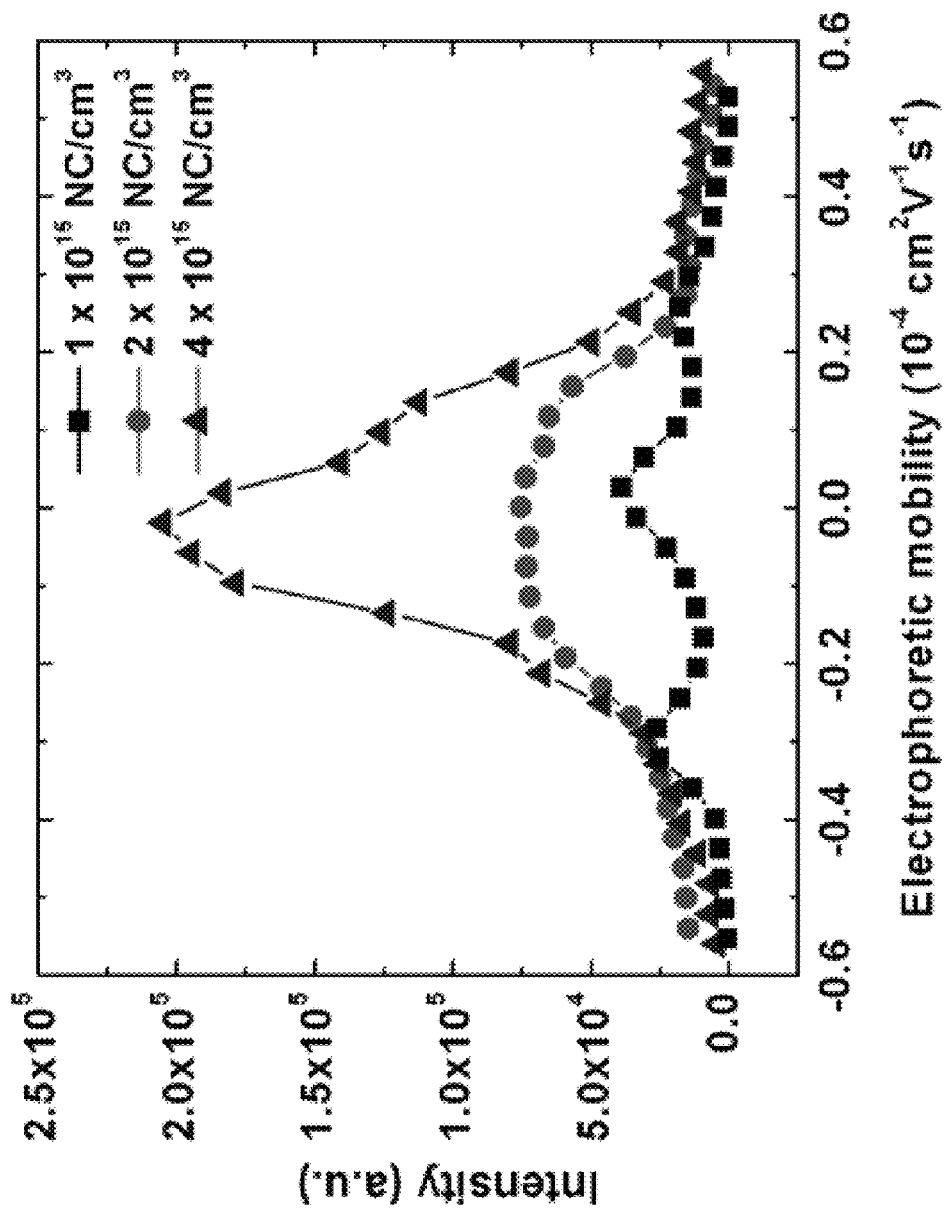
FIG. 6 shows the electrophoretic mobility measurements of the EPD suspensions with different nanocrystal concentrations.

EPD of the $Eu_2O_3$ nanocrystals was performed at different applied voltages (250, 500, 750 and 1000 V) and with different nanocrystal concentrations ($1\times10^{15}$, $2\times10^{15}$ and $4\times10^{15}$ NC $cm^{-3}$) to understand their effect on the thickness and uniformity of the nanocrystal film. Thickness measurements were conducted at five locations on three different samples, and the average thickness was determined with the standard deviation of the thicknesses as the error bar. Hence, the error bar conveys the thickness uniformity of the film. FIG. 5 shows the graph of the nanocrystal film thickness as a function of the applied voltage for different nanocrystal concentrations. The film thickness increased as a function of the applied voltage and nanocrystal concentration, as expected. When the applied voltage was increased, more nanocrystals moved toward the electrodes under the influence of increased electric field and deposited to form films. Similarly, when the nanocrystal concentration was increased, more charged nanocrystals were available for deposition, which led to the formation of thicker films. By performing electrophoretic mobility measurements on the EPD suspensions of different nanocrystal concentrations, it was confirmed that more charged nanocrystals were available for deposition as the nanocrystal concentration increased. FIG. 6 shows that the scattering intensity of the particles increased with nanocrystal concentration for a given electrophoretic mobility. Subsequently, the thickness of the nanocrystal film increased with the EPD process parameters (applied voltage and nanocrystal concentration). During EPD, a constant applied voltage was maintained, but the nanocrystal concentration of the EPD suspension decreased with time as the $Eu_2O_3$ nanocrystal film grew. The growth of the film slowed as the EPD progressed. The two factors that slowed down the growth were: (a) the increasing voltage drop across the growing film of the insulating $Eu_2O_3$ nanocrystals and (b) the depletion of charged nanocrystals from the EPD suspension. Since voltage drop across the film increased as the film grew, the effective voltage across the EPD suspension decreased because the applied voltage was constant. For a given nanocrystal concentration, thicker nanocrystal films were deposited when higher applied voltages were employed. The application of higher voltage between the electrodes facilitated an increased effective voltage across the EPD suspension, resulting in thicker films. Since thicker films were deposited with higher applied voltages for a given nanocrystal concentration, the nanocrystal suspension was not entirely depleted of charged nanocrystals. Thus, the increasing voltage drop across the growing $Eu_2O_3$ nanocrystal film was primarily responsible for restricting growth of the film.

EPD process parameters (applied voltage and nanocrystal concentration) altered the uniformity of the $Eu_2O_3$ nanocrystal film as illustrated in FIG. 5). For a given nanocrystal concentration, film uniformity decreased (larger error bar) as the applied voltage increased. Also, the thickness uniformity decreased (larger error bar) for higher nanocrystal concentrations for a given applied voltage. Although the films were increasingly non-uniform, we observed a particular pattern in thickness variation. The films were thick towards the edges of the electrode and were thin in the centre of the electrode, which suggested the presence of strong fringe electric fields near the edges of the electrode. Naturally the fringe field increased with applied voltage; therefore, more nanocrystals deposited near the edges of the electrode, increasing the non-uniformity of the film. Also, the non-uniformity of the film increased when the nanocrystal concentration increased. Since the same EPD setup (deposition area: 18 mm×13 mm electrode, 5 mm gap) was employed for all the depositions, variation in the thickness uniformity of the film was purely a result of changes in the EPD process parameters. Thus, the nanocrystal concentration and the applied voltage cannot be increased indefinitely to increase deposition rate or film thickness because they affect the uniformity of the EPD film.

Figure 7A:
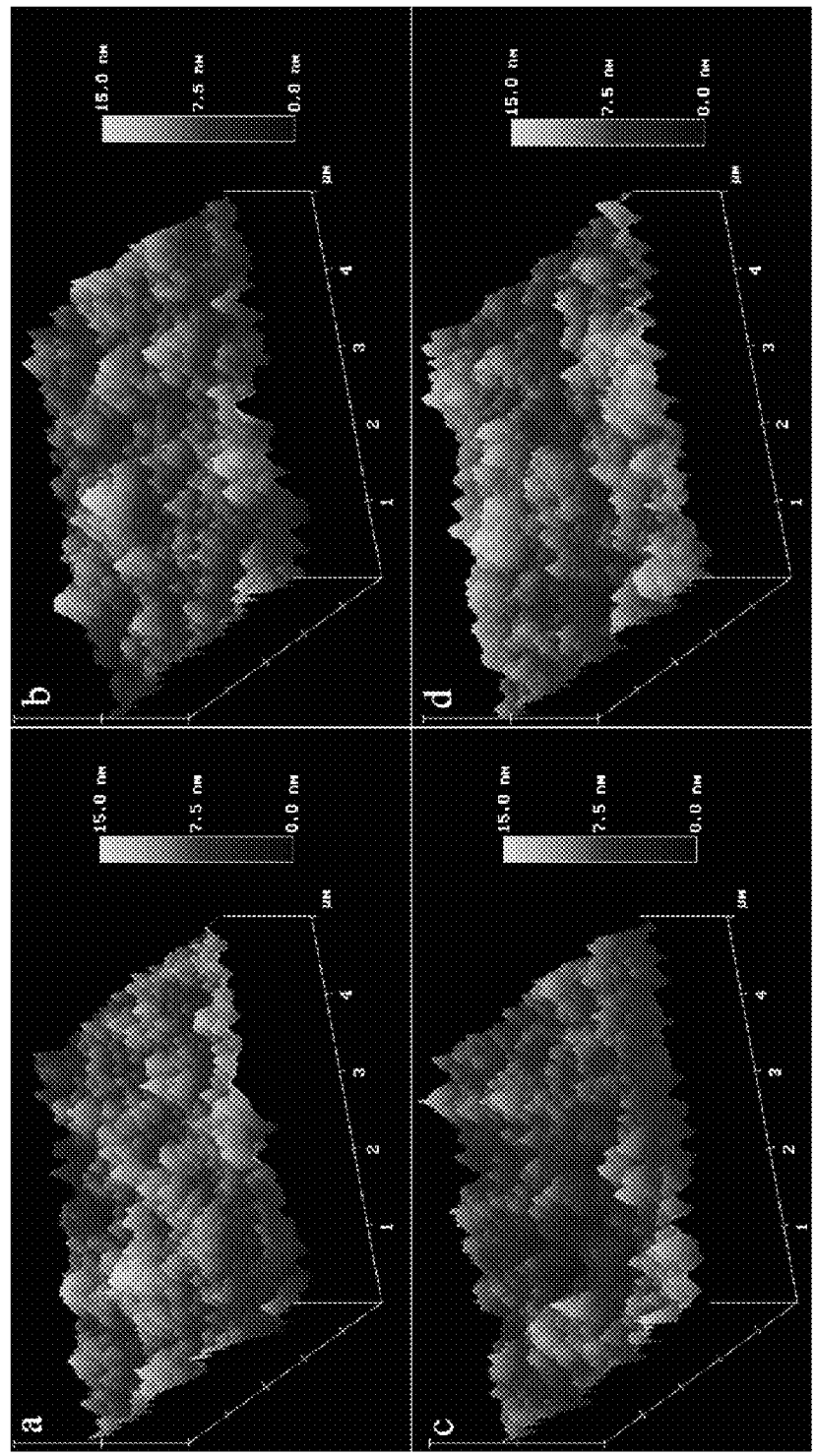
FIG. 7 shows AFM images ((a), (b), (c), and (d)) and EDS spectrum ((e), (f), (g), and (h)) of the nanocrystal films deposited with the nanocrystal suspension concentration of $4 \times 10^{15}$ NC $cm^{-3}$ at the applied voltages of 250 V, 500 V, 750 V and 1000 V, respectively. The AFM images of the films reveal the agglomerate size of about 130-160 nm and RMS roughness of about 1.6-1.8 nm. The morphology and composition of the films were comparable.
Figure 7B:
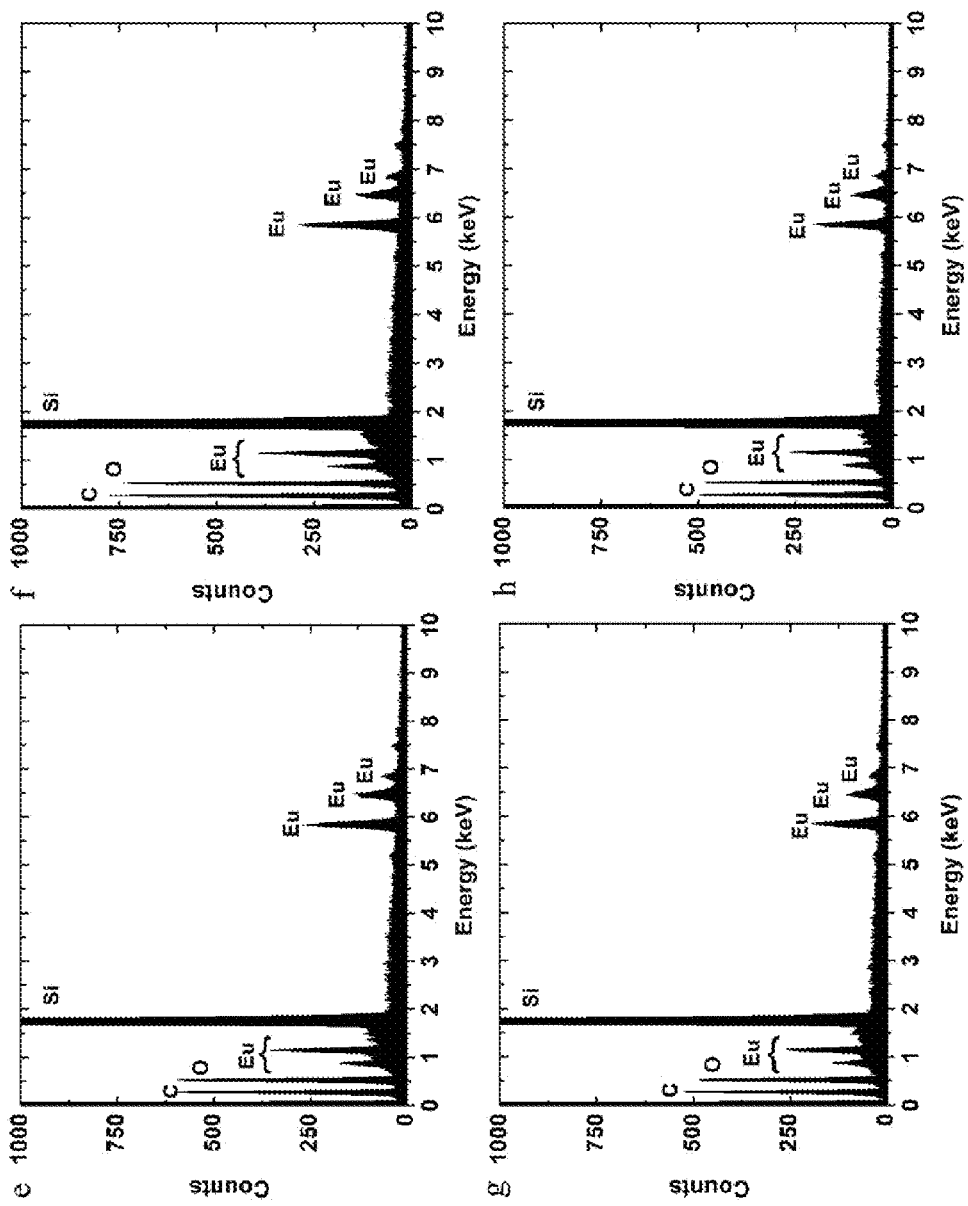
Figure 8:
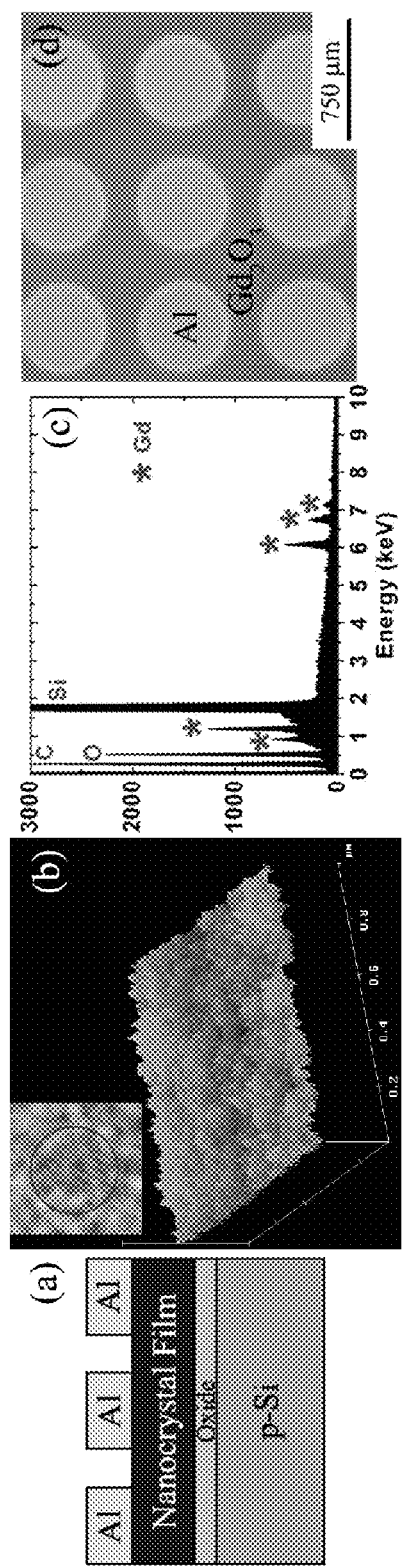
FIG. 8 shows: (a) a schematic of the MOS capacitor structures with NC film as the gate oxide layer according to one embodiment of the present invention; (b) AFM image of the NC film (1 $\mu m^2$ area, height: 20 nm/div) with RMS roughness of about 1.6 nm; inset: TEM image of the about 2.4 nm diameter $Gd_2O_3$ nanocrystals (Image: 6 nm×6 nm); (c) EDS spectrum of the NC film; and (d) SEM image (top view) of the MOS capacitor structures.

The microscopic morphology and the elemental composition of the EPD films formed according to various embodiments of the present invention were analysed as a function of film thickness, which explained whether the nanocrystals underwent any chemical, geometrical or topological modifications while being deposited under the EPD electric field. It was chosen to interrogate films produced from the highest nanocrystal concentration, $4 \times 10^{15}$ NC cm$^{-3}$, according to one embodiment of the present invention, as they yielded the most substantial deviations from uniformity in the topology, substrate coverage and roughness in the films when assessed at the macroscopic level. It was surmised that such film characteristics would yield the largest changes in microscopic/nanoscale topology, morphology and compositional changes, if any such change existed. AFM imaging and EDS analysis were performed on the four films with different thicknesses, which were deposited at four different applied voltages formed according to various embodiments of the present invention. FIGS. 7(*a*)-(*d*) show AFM images of the EPD films deposited at 250 V, 500 V, 750 V and 1000 V, respectively. The films were composed of agglomerates of the $Eu_2O_3$ nanocrystals, which were approximately 130-160 nm in diameter. These agglomerates formed from $4 \times 10^{15}$ NC cm$^{-3}$ nanocrystal concentration were much larger than the observed agglomerates deposited from the lower $2 \times 10^{15}$ NC cm$^{-3}$ nanocrystal concentration (FIG. 3(*b*)). The agglomerate size was consistent across individual films and was nearly identical for different applied voltages (FIGS. 7(*a*)-(*d*)). The smoothness of all the films was comparable. The RMS surface roughness, determined from an analysis of the AFM images of the films, varied between about 1.6 and 1.8 nm. This roughness was still smaller than the diameter of one nanocrystal. Thus, the films maintained a smooth topography as a function of film thickness/applied voltage.

Additionally, EDS analysis of the films was performed to juxtapose their compositions. EDS analyses were performed on small, cleaved sections of the EPD films placed onto silicon substrates rather than on the original ITO-coated glass substrates. This step was utilized since the contribution of oxygen signal from the substrate dominated the oxygen signal from the $Eu_2O_3$ nanocrystal films. Silicon substrates were chosen because their EDS peaks do not coincide with the europium and oxygen peaks. FIGS. 7(*e*)-(*h*) show the EDS graphs of the EPD films, deposited at 250 V, 500 V, 750 V and 1000 V, respectively. To compare the composition of the nanocrystals, it was monitored the intensity of the oxygen peak (K line: 0.52 keV) relative to the intensity of the europium peak (M line: 5.84 keV). The average ratio of intensities, 2.32±0.13, was within 5% of all four of the intensity ratios, which confirmed that the composition of the nanocrystals in the films did not change as a function of, or because of, the applied voltage. Thus, these analyses confirmed that the morphology, composition and topology of the film at the microscopic level remained consistent as the film thickness increased.

In sum, in one aspect, transparent films of about 2.4 nm diameter $Eu_2O_3$ nanocrystals were deposited successfully onto conducting substrates from nanocrystal suspensions, prepared in hexane, using the EPD technique according to various embodiments of the present invention. The films comprised agglomerates (about 15 nm) of $Eu_2O_3$ nanocrystals, which likely formed under the influence of the electric field applied during EPD. The small size of the agglomerates scattered a small fraction of visible light, which reduced light scattering losses, and thus enhanced transparency of the film (>80%) in the visible region. The films were uniform, smooth and densely packed with a packing fraction of about 0.56 (glassy packing regime). The films maintained very low RMS surface roughness (about 1.4 nm). The effect of the EPD process parameters (applied voltage and nanocrystal concentration) on growth of these transparent films was evaluated. The thickness of the nanocrystal films increased with applied voltage and nanocrystal concentration; however, growth of transparent films of the $Eu_2O_3$ nanocrystals slowed down with deposition time. The voltage drop across the film of insulating $Eu_2O_3$ nanocrystals played a primary role and the depletion of nanocrystals from the suspension played a secondary role in suppressing the growth of the films. Nonuniformity of the nanocrystal film increased with applied voltage and nanocrystal concentration, which was attributed to the effect of a fringe electric field. Knowledge of the effect of EPD process parameters on the overall quality of the nanocrystal films may prove helpful to the deposition of other nanocrystal systems. Insight gained into the growth of high quality electrophoretically deposited films of the colloidal nanocrystals would be beneficial in the design and production of nanocrystal-based optical, magnetic and electronic devices.

Example 2

Gd$_2$O$_3$ Nanocrystal Films

Gadolinium oxide (Gd$_2$O$_3$) in its crystalline and amorphous phases has been of research interest as a replacement gate oxide material for silicon dioxide because of its high dielectric constant ($\kappa$=14) [58]. Nanocrystals (NCs) of Gd$_2$O$_3$ have been investigated for their applications as a magnetic contrast agents [59, 60], and host materials in Eu$^{3+}$- and Tb$^{3+}$-doped light emitting materials [61]. Recently, dielectric studies of amorphous Gd$_2$O$_3$ films, embedded with Gd$_2$O$_3$ NCs, revealed intriguing charge storage characteristics of the NCs [62]. Similarly, metallic NCs (Au, Ru, Ni, and Co) [63-65] and semiconducting NCs (Si and Ge) [66, 67] have exhibited charge-storage characteristics when they were embedded in the gate oxide layer of a metal-oxide-semiconductor (MOS) structure for non-volatile memory (NVM) applications. NC confined states, the states at the interface of NC-dielectric (i.e. NC surface), and the defect sites inside NCs are responsible for charge-storage behavior [63, 68, 69]. Colloidal NCs may possess similar charge-storage capabilities because of the unpassivated surface states that can arise due to the detachment of some fraction of the nanocrystals' surface capping ligands during cleaning procedure [70-72]. Dielectric studies of films composed entirely of colloidal Gd$_2$O$_3$ NCs may provide insight into this subject. An effective technology for the fabrication of casts of particles, electrophoretic deposition (EPD) can produce densely-packed films of colloidal NCs at high deposition rates [70, 73]. According to various embodiments of the present invention, EPD was employed to produce films consisting only of colloidal Gd$_2$O$_3$ NCs to be used as the gate oxide layer in MOS architecture. Capacitance-voltage (C-V) measurements of these MOS structures exhibited hysteresis, illustrating the charge-storage capabilities of the films. The dielectric constant of the NC films ($\kappa$) was determined from C-V measurements of the MOS structures with different NC film thicknesses. Since the dielectric constant of the NC films depended on the packing density of NCs within the films, $\kappa$ subsequently was used to determine the NC packing density.

Fabrication of MOS Capacitor Structures and Characterizations.

In one embodiment of the present invention, as shown in the schematic of FIG. 8(a), MOS capacitor structures were fabricated, composed of films of ultra-small colloidal Gd$_2$O$_3$ NCs employed as the dielectric oxide layer. The about 2.4 nm diameter Gd$_2$O$_3$ nanocrystals were synthesized via a two-stage solution-phase technique and were capped with oleic acid [71]. The as-synthesized NCs were cleaned in ethanol using a precipitation-centrifugation sequence, described elsewhere [71]. After purifying the Gd$_2$O$_3$ NCs, they were suspended in hexane and then were deposited onto p-(100) silicon substrates [epi layer: 20-40 $\Omega\cdot$cm and substrate: 0.005-0.025 $\Omega\cdot$cm] via electrophoretic deposition. For EPD, a pair of silicon electrodes (25 mm×13 mm) was mounted in a parallel-plate configuration with a gap of about 5 mm. A DC voltage of 500 V was applied to the electrode pair using a Keithley 6517A electrometer. The voltage was applied for 15 min during the deposition and, subsequently, for 5 min during an air drying step of the film to improve densification of the film [70, 74]. The NCs deposited on both the cathode and the anode. FIG. 8(b) shows an image of the NC film (anode) captured using a Nanoscope III atomic force microscope (AFM). The film was continuous and topologically smooth with root mean square (RMS) roughness of about 1.6 nm, which was smaller than the diameter of the nanocrystals (about 2.4 nm). An image of the nanocrystals acquired with Philips CM 20 transmission electron microscope (TEM) is shown as an inset to FIG. 8(b). It was confirmed the deposition of the Gd$_2$O$_3$ NCs by performing energy dispersive spectroscopy (EDS) of the film using a Link ISIS series 300 microanalysis system. Shown in FIG. 8(c), the EDS spectrum of the film exhibits the gadolinium, oxygen, carbon, and silicon peaks, which are present due to the oleic acid-capped Gd$_2$O$_3$ NCs on the silicon substrate. To complete the fabrication of the MOS capacitors, aluminum contacts (500 μm diameter and 300 nm thick) were deposited on the Gd$_2$O$_3$ NC film via e-beam evaporation of aluminum using a shadow mask. Aluminum was chosen as the gate material because of its suitable work function and cost effectiveness. FIG. 8(d) shows the image, which is a top view, of the MOS capacitors recorded using a Hitachi S-4200 scanning electron microscope (SEM). MOS capacitors were fabricated with different oxide layer (NC film) thicknesses (116±10 nm, 179±10 nm, 276±10 nm, and 397±15 nm), which were verified using a Veeco Dektak 150 surface profiler. To vary thickness of the NC film, EPD suspensions of different NC concentrations (1.0×10$^{15}$ NC/cm$^3$, 1.5×10$^{15}$ NC/cm$^3$, 2.0×10$^{15}$ NC/cm$^3$, and 2.5×10$^{15}$ NC/cm$^3$) were employed.

C-V Measurements, and Calculations of the Dielectric Constant ($\kappa$) and the Packing Density.

Figure 9:
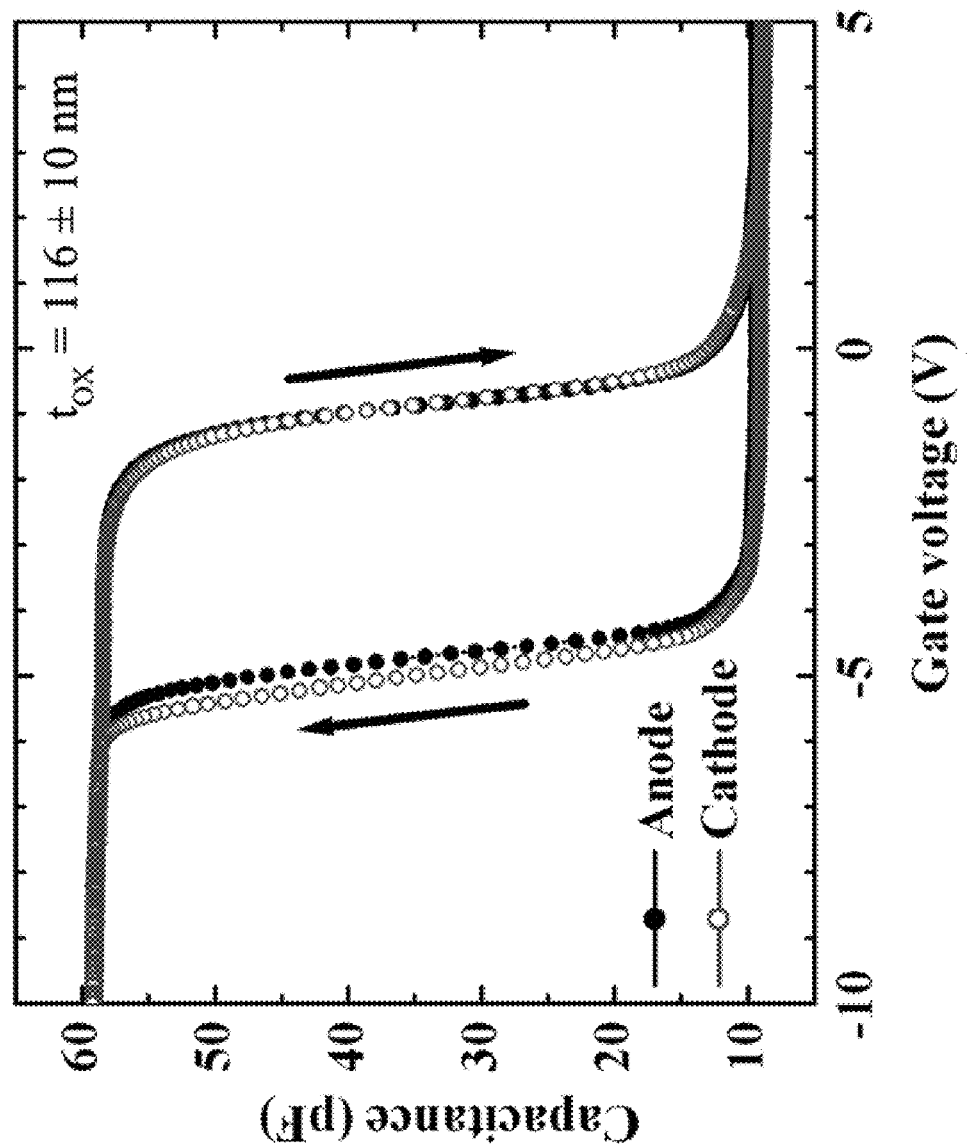
FIG. 9 shows C-V characteristics of the MOS capacitors, fabricated from NC films that were deposited on the anode and cathode according to one embodiment of the present invention. The thickness of the film was 116 nm±10 nm, and the average area of the capacitors was $1.96 \times 10^5 \mu m^2$.

High-frequency C-V measurements of the capacitors were performed at a frequency of 1 MHz and at a sweep rate of 50 mV/s, using a Keithley 590 CV analyzer on a Signatone probe station. The gate voltage was swept from −10 V (accumulation) to +5 V (inversion) and back to −10 V (accumulation). The capacitors were biased at −10 V for 15 min prior to the forward sweep and were biased at +5 V for 1 min prior to the reverse sweep. FIG. 9 shows the C-V characteristics of capacitors fabricated from 116 nm thick NC films, deposited on the anode and cathode. C-V characteristics of both capacitors are similar to that of a typical MOS capacitor with distinct accumulation, depletion, and inversion regions. The MOS capacitors exhibited a clockwise hysteresis in their C-V characteristics as they were biased through the accumulation-inversion-accumulation regions. The observed hysteresis indicated the presence of charge carriers within the NC film. The charge carriers could be immobile charges, arising from the unpassivated surface sites (Gd$^{3+}$ and O$^{2-}$) of the NCs, or mobile charges (electrons or holes), injected into the NC film. The presence of positive charges shifts the flat-band voltage ($V_{FB}$) in negative direction, while the presence of negative charges shifts it in positive direction. Assuming no charges in the NC film, the ideal flat-band voltage ($V_{FB}^{Ideal}$) of −0.88 V was based on the work functions of Al and Si and the doping concentration in the epi layer. A larger negative shift in $V_{FB}$ ($\Delta V_{FB}$ is about −3.92 V, anode) during reverse sweep (inversion-accumulation) than the positive shift in $V_{FB}$ ($\Delta V_{FB}$ is about 0.05 V, anode) during forward sweep (accumulation-inversion) suggested the presence of more positive charges in the NC film. Electrons were injected into the NC film from the gate electrode in the accumulation region, while electrons were subsequently extracted (equivalent to injection of holes) from the NC film into the gate electrode in the inversion region. To compare the charge-storage in the NC films deposited on the anode and cathode, it was measured the width of the hysteresis window (ΔV) for the two NC films [3.97 V (anode) and 4.19 V (cathode)]. These values were within the statistical uncertainty (±0.13 V) when multiple MOS capacitors were characterized. Similar to other metal [64], semiconductor [66, 67], and insulator [62] NC-embedded MOS capacitor structures, charge-storage was observed in the $Gd_2O_3$ NC films formed according to various embodiments of the present invention.

Figure 10:
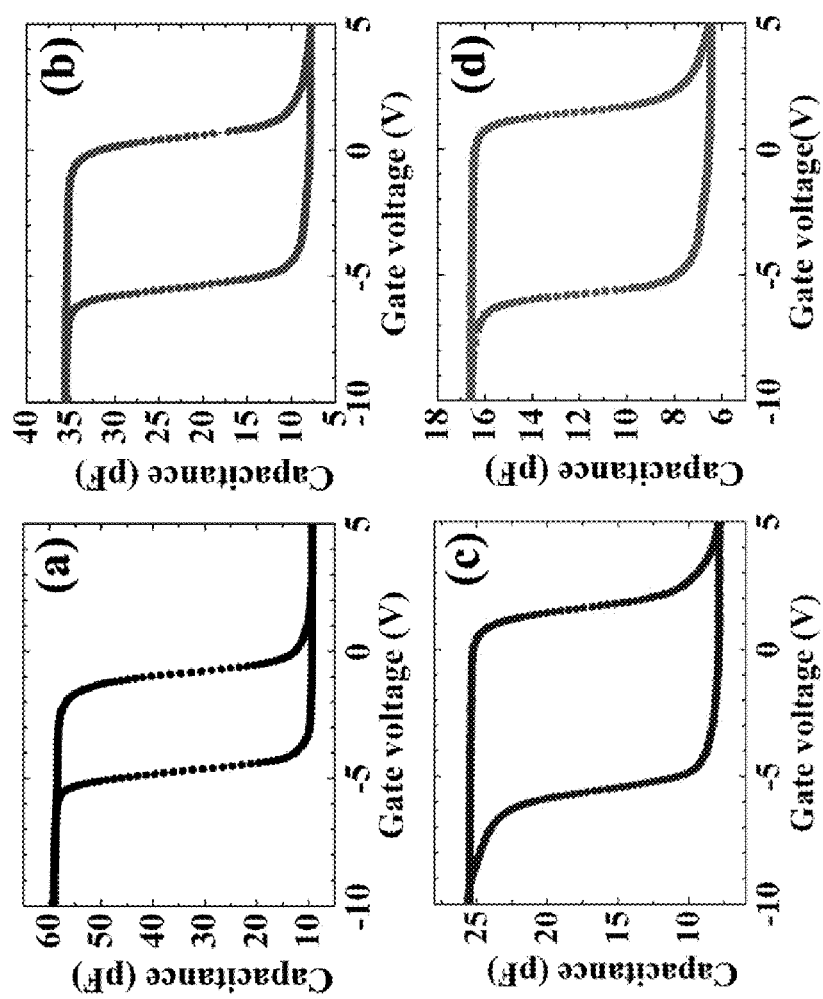
FIG. 10 shows C-V characteristics of the MOS capacitors with different thicknesses of the NC films (oxide layer) according to one embodiment of the present invention.

FIG. 10 shows C-V characteristics of the MOS capacitors for NC films of different thicknesses. The oxide capacitance, $C_{OX}$, in the accumulation region decreased with increased NC film thickness, as was expected. For a given gate dielectric material (typically oxide), the oxide capacitance (in accumulation) has a linear relationship with the inverse of the gate oxide thickness, as stated in equation 1 set forth below:

$$C_{OX} = \frac{A \times \varepsilon_{OX}}{t_{OX}} \quad (1)$$

Figure 11:
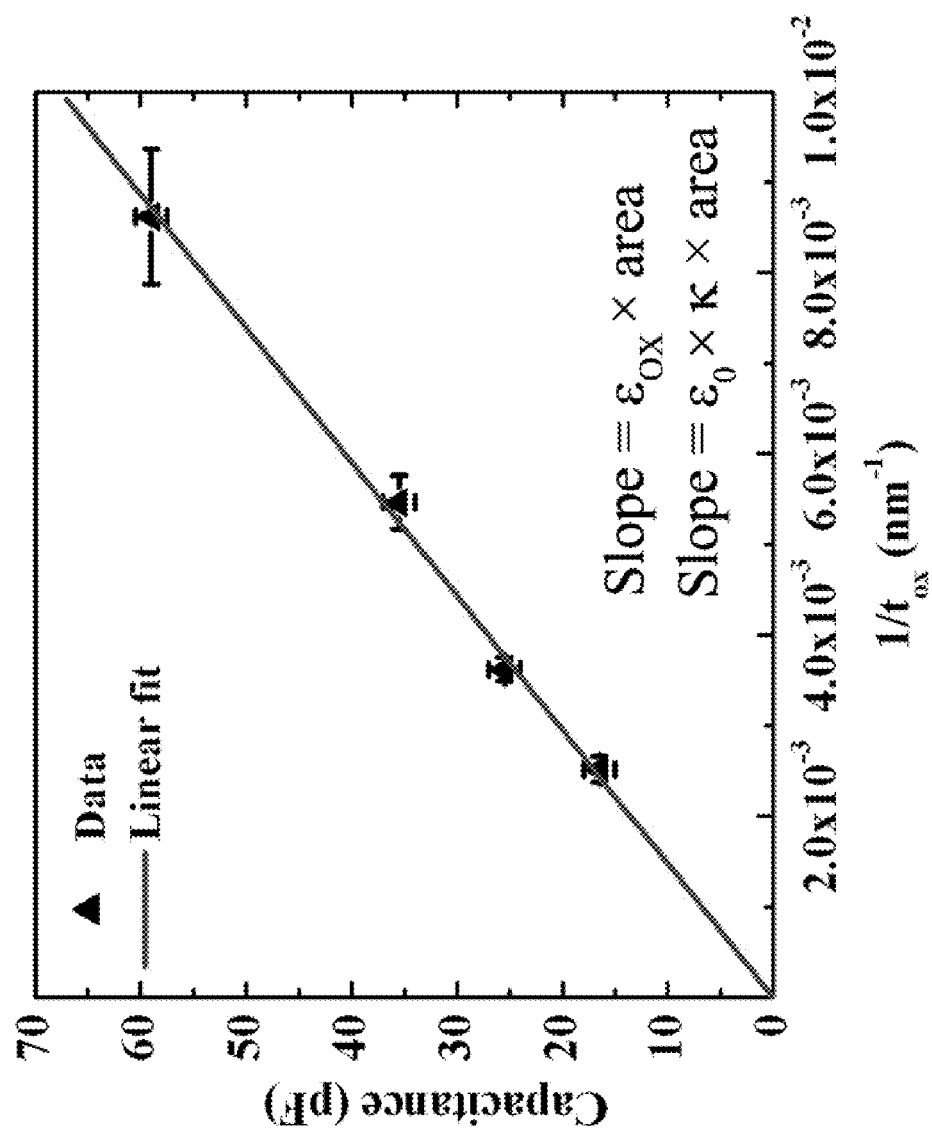
FIG. 11 shows a graph of capacitance versus inverse of NC film (oxide layer) thickness for four different MOS capacitors according to one embodiment of the present invention. The slope of the linear regression fit was proportional to the permittivity of the nanocrystal film and, hence, to the film's dielectric constant, $\kappa = 3.90$.

In this expression, $C_{OX}$ is the oxide capacitance (F), A is the gate area (cm$^2$), $t_{OX}$ is the oxide thickness (cm), and $\varepsilon_{OX}$ is the permittivity of the oxide material (F/cm). From the thickness and capacitance of the $Gd_2O_3$ NC film, the permittivity of the NC film can be determined. FIG. 11 shows a graph of the NC film capacitance as a function of the inverse of the NC film thickness for MOS capacitors with different NC film thicknesses. The data exhibited good agreement with the linear trend. The dielectric permittivity of the NC film was extracted from slope of the linear fit, given the area of the gate. The dielectric constant, κ, of the $Gd_2O_3$ NC film was calculated using the relation, $\kappa = \varepsilon_{OX}/\varepsilon_0$ and was found to be 3.90±0.06. Since the NC film comprised $Gd_2O_3$ (κ=14.0), oleic acid (κ=2.5), and air (κ=1.0), the effective dielectric constant of the NC film depended on the volumetric fractions of each component in the film. Good agreement between the data and the liner fit suggested that all of the NC films, cast from solutions with different NC concentrations, possessed comparable NC packing fractions. It was calculated the volumetric packing fractions of the NC film using a three-component Bruggeman model for the dielectric constant (Equations 2 and 3):

$$f_{air}\frac{\kappa_{air} - \kappa_{NC\,film}}{\kappa_{air} + 2\kappa_{NC\,film}} + f_{oleic}\frac{\kappa_{oleic} - \kappa_{NC\,film}}{\kappa_{oleic} + 2\kappa_{NC\,film}} + f_{Gd_2O_3}\frac{\kappa_{Gd_2O_3} - \kappa_{NC\,film}}{\kappa_{Gd_2O_3} + 2\kappa_{NC\,film}} = 0 \quad (2)$$

$$f_{air} + f_{oleic} + f_{Gd_2O_3} = 1 \quad (3)$$

In the expression, volume fractions of air, NC film, oleic acid, and $Gd_2O_3$ are given as $f_{air}$, $f_{NC\,film}$, $f_{oleic}$, and $f_{Gd_2O_3}$, respectively. Dielectric constants of air, NC film, and $Gd_2O_3$ are given as $\kappa_{air}$, $\kappa_{NC\,film}$, $\kappa_{oleic}$, and $\kappa_{Gd_2O_3}$, respectively. Based on the coverage of oleic acid on the surface of a spherical NC core, a relationship was formed between the volumetric fractions of the oleic acid surfactant and the $Gd_2O_3$ NC core as stated in equation 4, where $R_1$ is radius of the $Gd_2O_3$ NC core ($R_1$=1.2 nm±0.1), and $R_2$ is the radius of NC core plus thickness of the oleic acid layer (0.3±0.1 nm):

$$f_{oleic} = f_{Gd_2O_3}[(R_2/R_1)^3 - 1] \quad (4)$$

Volumetric fractions, $f_{Gd_2O_3}$=0.34±0.02, $f_{air}$=0.34±0.08, and $f_{oleic}$=0.32±0.10, were calculated from equations 2-4. The summed packing fraction for the nanocrystals ($Gd_2O_3$ NC core plus oleic acid) is 0.66±0.08 and resides within the glassy packing regime for closely packed spheres [75]. Thus, EPD can produce densely packed, glassy films of ultra-small nanocrystals that exhibit potential charge storage capabilities, surmised from their packing density and their effective dielectric constant.

Dielectric Properties of the Colloidal $Gd_2O_3$ NC Films.

Accordingly, in another aspect, MOS capacitor structures with colloidal $Gd_2O_3$ NC film as oxide layer were fabricated according to various embodiments of the present invention. Uniformly deposited films of the purified $Gd_2O_3$ NCs were produced via electrophoretic deposition. C-V measurements of the MOS capacitors exhibited clockwise hysteresis that suggested charge-storage within the NC films. The NC films, deposited on the anode and cathode, had similar charge-storage properties. NC films with different thicknesses showed charge-storage behavior. Dielectric constant (κ=3.90) of the NC films was calculated from the C-V measurements of the MOS capacitors. Packing density of the NCs within the film (0.66±0.08) was calculated from the dielectric constant of the NC film and was found to be within glassy-packing regime, as expected for the films deposited via EPD.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1] Dabbousi B O, Bawendi M G, Onitsuka O and Rubner M F, 1995 *Appl. Phys. Lett.* 66 1316-8.

[2] Shevchenko E V, Talapin D V, Kotov N A, O'Brien S and Murray C B 2006 *Nature* 439 55-9.

[3] Mirkin C A, Letsinger R L, Mucic R C and Storhoff J J 1996, *Nature* 382 607-9.

[4] Murray C B, Kaganii C R and Bawendi M G 1995 *Science*, 270 1335-8.

[5] Dabbousi B O, Murray C B, Rubner M F and Bawendi M G, 1994 *Chem. Mater.* 6 216-9.

[6] Kim F, Kwan S, Akana J and Yang P 2001 *J. Am. Chem. Soc.*, 123 4360-1.

[7] Islam M A and Herman I P 2002 *Appl. Phys. Lett.* 80 3823-5.

[8] Singh I, Kaya C, Shaffer M S P, Thomas B C and Boccaccini A R 2006 *J. Mater. Sci.* 41 8144-51.

[9] Mahajan S V, Hasan S A, Cho J, Shaffer M S P, Boccaccini A R and Dickerson J H 2008 *Nanotechnology* 19 195301.

[10] Maenosono S, Okubo T and Yamaguchi Y 2003 *J. Nanopart. Res.* 5 5-15.

[11] Giersig M and Mulvaney P 1993 *J. Phys. Chem.* 97 6334-6.

[12] Teranishi T, Hosoe M, Tanaka T and Miyake M 1999 *J. Phys. Chem. B* 103 3818-27.
[13] Wong E M and Searson P C 1999 *Appl. Phys. Lett.* 74 2939-41.
[14] Dor S, Ruhle S, Ofir A, Adler M, Grinis L and Zaban A 2009, *Colloids Surf* A 342 70-5.
[15] Ferrari B, Bartret A and Baudin C 2009 *J. Eur. Ceram. Soc.*, 29 1083-92.
[16] Mahajan S V, Cho J, Shaffer M S P, Boccaccini A R and Dickerson J H 2010 *J. Eur. Ceram. Soc.* 30 1145-50.
[17] Castro Y, Ferrari B, Moreno R and Duran A 2004 *Surf Coat. Technol.* 182 199-203.
[18] Jung D, Tabellion J and Clasen R 2006 *Key Eng. Mater.*, 314 81-8.
[19] Islam M A, Xia Y Q, Steigerwald M L, Yin M, Liu Z, O'Brien S, Levicky R and Herman I P 2003 *Nano Lett.*, 3 1603-6.
[20] Somarajan S, Hasan S A, Adkins C T, Harth E and Dickerson J H 2008 *J. Phys. Chem. B* 112 23-8.
[21] Zhao G F, Ishizaka T, Kasai H, Hasegawa M, Furukawa T, Nakanishi H and Oikawa H 2009 *Chem. Mater.* 21 419-24.
[22] Boccaccini A R, Cho J, Roether J A, Thomas B J C, Minay E J and Shaffer M S P 2006 *Carbon* 44 3149-60.
[23] Cho J, Schaab S, Roether J A and Boccaccini A R 2008 *J. Nanopart. Res.* 10 99-105.
[24] Du C S and Pan N 2006 *Nanotechnology* 17 5314-8.
[25] Du C S and Pan N 2006 *J. Power Sources* 160 1487-94.
[26] Thomas B J C, Boccaccini A R and Shaffer M S P 2005 *J. Am. Ceram. Soc.* 88 980-2.
[27] Thomas B J C, Shaffer M S P, Freeman S, Koopman M, Chawla K K and Boccaccini A R 2006 *Key Eng. Mater.*, 314 141-6.
[28] Islam M A and Xia S G 2009 *J. Phys.: Condens. Matter* 21 8.
[29] Murray C B, Kagan C R and Bawendi M G 2000 *Annu. Rev. Mater. Sci.* 30 545-610.
[30] Park J, Joo J, Kwon S G, Jang Y and Hyeon T 2007 *Angew. Chem. Int. Edn* 46 4630-60.
[31] Mahajan S V and Dickerson J H 2007 *Nanotechnology*, 18 325605.
[32] Raue R, Vink A T and Welker T 1989 *Philips Tech. Rev.* 44, 335-47.
[33] Mochizuki S, Nakanishi T, Suzuki Y and Ishi K 2001 *Appl. Phys. Lett.* 79 3785-7.
[34] Hamaker H C 1940 *Trans. Faraday Soc.* 36 279-83.
[35] Besra L and Liu M 2007 *Prog. Mater. Sci.* 52 1-61.
[36] De D and Nicholson P S 1999 *J. Am. Ceram. Soc.* 82 3031-6.
[37] Ferrari B, Sanchez-Herencia A J and Moreno R 1998 *Mater. Lett.* 35 370-4.
[38] Sarkar P, Huang X N and Nicholson P S 1992 *J. Am. Ceram. Soc.* 75 2907-9.
[39] Sarkar P, Huang X N and Nicholson P S 1993 *J. Am. Ceram. Soc.* 76 1055-6.
[40] Tang F Q, Uchikoshi T, Ozawa K and Sakka Y 2002 *Mater. Res. Bull.* 37 653-60.
[41] Islam M A, Xia Y Q, Telesca D A, Steigerwald M L and Herman I P 2004 *Chem. Mater.* 16 49-54.
[42] Cushing B L, Kolesnichenko V L and O'Connor C J 2004, *Chem. Rev.* 104 3893-946.
[43] Sigmund W M, Bell N S and Bergstrom L 2000 *J. Am. Ceram. Soc.* 83 1557-74.
[44] Vandeperre L, Zhao C and Van der Biest O 1999 *6th Conf. and Exhibition of the European Ceramic Society* (Brighton: Institute of Materials) pp 69-74.
[45] Fowkes F M and Pugh R J 1984 *ACS Symp. Ser.* vol 240 (Washington, D.C.: American Chemical Society) pp 331-54.
[46] Morrison I D 1993 *Colloids Surf A* 71 1-37.
[47] Morrison I D and Ross S 2002 *Colloidal Dispersions: Suspension, Emulsions, and Foams* (New York: Wiley-Interscience).
[48] Shim M and Guyot-Sionnest P 1999 *J. Chem. Phys.*, 111 6955-64.
[49] Basu R N, Randall C A and Mayo M J 2001 *J. Am. Ceram. Soc.*, 84 33-40.
[50] Chen F and Liu M 2001 *J. Eur. Ceram. Soc.* 21 127-34.
[51] Carnall W T, Fields P R and Rajnak K 1968 *J. Chem. Phys.*, 49 4450-5.
[52] Dieke G H 1968 *Spectra and Energy Levels of Rare Earth Ions in Crystals* (New York: Wiley).
[53] Wakefield G, Keron H A, Dobson P J and Hutchison J L 1999, *J. Colloid Interface Sci.* 215 179-82.
[54] Mahajan S V, Kavich D W, Redigolo M L and Dickerson J H 2006 *J. Mater. Sci.* 41 8160-5.
[55] Scott G D and Kilgour D M 1969 *J. Phys. D: Appl. Phys.* 2 863-6.
[56] Wang Y C, Leu I C and Hon M H 2004 *J. Am. Ceram. Soc.* 87 84-8.
[57] Zhitomirsky I and Galor L 1997 *J. Mater. Sci., Mater. Med.*, 8 213-9.
[58] J. Kwo, M. Hong, A. R. Kortan, K. T. Queeney, Y. J. Chabal, J. P. Mannaerts, T. Boone, J. J. Krajewski, A. M. Sergent, and J. M. Rosamilia, Appl. Phys. Lett. 77, 130 (2000).
[59] J. L. Bridot, A. C. Faure, S. Laurent, C. Riviere, C. Billotey, B. Hiba, M. Janier, V. Josserand, J. L. Coll, L. Vander Elst, R. Muller, S. Roux, P. Perriat, and O. Tillement, J. Am. Chem. Soc. 129, 5076 (2007).
[60] J. Y. Park, M. J. Baek, E. S. Choi, S. Woo, J. H. Kim, T. J. Kim, J. C. Jung, K. S. Chae, Y. Chang, and G. H. Lee, ACS Nano 3, 3663 (2009).
[61] R. Bazzi, M. A. Flores-Gonzalez, C. Louis, K. Lebbou, C. Dujardin, A. Brenier, W. Zhang, O. Tillement, E. Bernstein, and P. Perriat, J. Lumin. 102, 445 (2003).
[62] J. C. Wang, C. S. Lai, Y. K. Chen, C. T. Lin, C. P. Liu, M. R. S. Huang, and Y. C. Fang, Electrochem. Solid State Lett. 12, H202 (2009).
[63] W. H. Guan, S. B. Long, M. Liu, Z. G. Li, Y. Hu, and Q. Liu, J. Phys. D-Appl. Phys. 40, 2754 (2007).
[64] B. Park, K. Cho, H. Kim, and S. Kim, Semicond. Sci. Technol. 21, 975 (2006).
[65] S.-S. Yim, M.-S. Lee, K.-S. Kim, and K.-B. Kim, Appl. Phys. Lett. 89, 093115 (2006).
[66] A. Kanjilal, J. L. Hansen, P. Gaiduk, A. N. Larsen, N. Cherkashin, A. Clayerie, P. Normand, E. Kapelanakis, D. Skarlatos, and D. Tsoukalas, Appl. Phys. Lett. 82, 1212 (2003).
[67] S. Duguay, J. J. Grob, A. Slaoui, Y. Le Gall, and M. Amann-Liess, J. Appl. Phys. 97, 5 (2005).
[68] Y. Liu, T. P. Chen, L. Ding, S. Zhang, Y. Q. Fu, and S. Fung, J. Appl. Phys. 100, 3 (2006).
[69] Y. Shi, K. Saito, H. Ishikuro, and T. Hiramoto, J. Appl. Phys. 84, 2358 (1998).
[70] M. A. Islam and I. P. Herman, Appl. Phys. Lett. 80, 3823 (2002).
[71] S. V. Mahajan and J. H. Dickerson, Nanotechnology 18, 325605 (2007).
[72] S. A. Hasan, D. W. Kavich, and J. H. Dickerson, Chem. Commun. 3723 (2009).

[73] S. V. Mahajan, S. A. Hasan, J. Cho, M. S. P. Shaffer, A. R. Boccaccini, and J. H. Dickerson, Nanotechnology 19, 8 (2008).
[74] S. A. Hasan, D. W. Kavich, S. V. Mahajan, and J. H. Dickerson, Thin Solid Films 517, 2665 (2009).
[75] G. D. Scott and D. M. Kilgour, J. Phys. D-Appl. Phys. 2, 863 (1969).
[76] Shionoya S, and Yen W. M., 1999, *Phosphor Handbook* (Boca Raton: CRC Press).
[77] Kwo J., Hong M., Kortan A. R., Queeney K. L., Chabal Y. J., Opila R. L., Muller D. A., Chu S. N. G., Sapjeta B. J., Lay T. S., Mannaerts J. P., Boone T., Krautter H. W., Krajewski J. J., Sergnt A. M., and Rosamilia J. M., 2001, *Properties of high kappa gate dielectrics $Gd_2O_3$ and $Y_2O_3$ for Si, Journal of Applied Physics* 89 3920-7.
[78] Blasse G. and Grabmaier B. C., 1994, *Luminescent Materials* (Berlin: Springer).

What is claimed is:

1. A metal-oxide-semiconductor (MOS) capacitor, comprising:
   (a) a silicon substrate having a first surface;
   (b) a film of lanthanide oxide nanoparticles functioning as a charge storage of the MOS capacitor and formed by electrophoretically depositing pre-formed lanthanide oxide nanoparticles directly on the first surface of the silicon substrate; and
   (c) an aluminum film formed on the film of lanthanide oxide nanoparticles.

2. The metal-oxide-semiconductor (MOS) capacitor of claim 1, wherein the silicon substrate comprises p-type silicon.

3. The metal-oxide-semiconductor (MOS) capacitor of claim 2, wherein the first surface of the silicon substrate is a p-(100) surface of silicon.

4. The metal-oxide-semiconductor (MOS) capacitor of claim 1, wherein the lanthanide oxide nanoparticles comprise europium oxide ($Eu_2O_3$) nanoparticles or gadolinium oxide ($Gd_2O_3$) nanoparticles.

5. The metal-oxide-semiconductor (MOS) capacitor of claim 1, wherein the film of lanthanide oxide nanoparticles has a thickness ranging from about 50 to about 500 nm.

6. The metal-oxide-semiconductor (MOS) capacitor of claim 1, wherein the aluminum film has a thickness of about 300 nm.

7. The metal-oxide-semiconductor (MOS) capacitor of claim 1, wherein the aluminum film is formed on the film of lanthanide oxide nanoparticles using electron-beam evaporation.

8. The metal-oxide-semiconductor (MOS) capacitor of claim 1, wherein the film of lanthanide oxide nanoparticles comprises randomly close-packed lanthanide oxide nanoparticles with a packing density of about 66%.

* * * * *